United States Patent
Ishikawa et al.

(10) Patent No.: US 12,278,032 B2
(45) Date of Patent: Apr. 15, 2025

(54) PHOTOSENSITIVE RESIN COMPOSITION, CURED FILM, INDUCTOR AND ANTENNA

(71) Applicant: FUJIFILM Corporation, Tokyo (JP)

(72) Inventors: Tatsuo Ishikawa, Haibara-gun (JP); Tatsuo Mikami, Odawara (JP)

(73) Assignee: FUJIFILM Corporation, Tokyo (JP)

( * ) Notice: Subject to any disclaimer, the term of this patent is extended or adjusted under 35 U.S.C. 154(b) by 820 days.

(21) Appl. No.: 17/487,269

(22) Filed: Sep. 28, 2021

(65) Prior Publication Data
US 2022/0013264 A1 Jan. 13, 2022

Related U.S. Application Data

(63) Continuation of application No. PCT/JP2020/011861, filed on Mar. 18, 2020.

(30) Foreign Application Priority Data

Mar. 29, 2019 (JP) ................................ 2019-067590

(51) Int. Cl.
| | | |
|---|---|---|
| *H01F 1/153* | (2006.01) | |
| *B82Y 25/00* | (2011.01) | |
| *B82Y 30/00* | (2011.01) | |
| *B82Y 40/00* | (2011.01) | |
| *C08F 2/50* | (2006.01) | |
| *C08K 3/11* | (2018.01) | |
| *C08L 101/00* | (2006.01) | |
| *G03F 7/004* | (2006.01) | |
| *H01F 1/28* | (2006.01) | |

(52) U.S. Cl.
CPC ............ *H01F 1/15308* (2013.01); *C08F 2/50* (2013.01); *C08K 3/11* (2018.01); *C08L 101/00* (2013.01); *G03F 7/004* (2013.01); *H01F 1/15375* (2013.01); *H01F 1/28* (2013.01); *B82Y 25/00* (2013.01); *B82Y 30/00* (2013.01); *B82Y 40/00* (2013.01)

(58) Field of Classification Search
CPC .... H01F 1/15308; H01F 1/15375; H01F 1/28; G03F 7/028
See application file for complete search history.

(56) References Cited

U.S. PATENT DOCUMENTS

| | | | | |
|---|---|---|---|---|
| 2009/0035452 A1* | 2/2009 | Kusano | ................. | G03F 7/0007 |
| | | | | 427/58 |
| 2012/0267151 A1 | 10/2012 | Hojo et al. | | |
| 2015/0287507 A1 | 10/2015 | Nishio et al. | | |
| 2019/0369497 A1 | 12/2019 | Mori et al. | | |

FOREIGN PATENT DOCUMENTS

| | | | |
|---|---|---|---|
| CN | 102596455 A | | 7/2012 |
| JP | 2003-151815 A | | 5/2003 |
| JP | 2005-024628 | * | 1/2005 |
| JP | 2011-22014 A | | 2/2011 |
| JP | 4760709 B2 | | 8/2011 |
| JP | 2013-29760 A | | 2/2013 |
| JP | 2017-36221 A | | 2/2017 |
| TW | 200610484 A | | 3/2006 |
| WO | WO 2006/009051 A1 | | 1/2006 |
| WO | WO 2011/040189 A1 | | 4/2011 |
| WO | WO 2018/155104 A1 | | 8/2018 |

OTHER PUBLICATIONS

Taiwanese Office Action and Search Report for corresponding Taiwanese Application No. 109110318, dated Aug. 14, 2023, with English translation.
International Preliminary Report on Patentability, dated Oct. 14, 2021, and Written Opinion of the International Searching Authority, dated Jun. 9, 2020, for International Application No. PCT/JP2020/011861, with an English translation.
International Search Report for International Application No. PCT/JP2020/011861, dated Jun. 9, 2020, with an English translation.
Extended European Search Report for European Application No. 20785285.6, dated Apr. 28, 2022.
Japanese Office Action for corresponding Japanese Application No. 2021-511408, dated Oct. 18, 2022, with English translation.
Korean Office Action for corresponding Korean Application No. 10-2021-7030400, dated Aug. 23, 2023, with English translation.
European Communication pursuant to Article 94(3) EPC for corresponding European Application No. 20 785 285.6, dated Jan. 7, 2025.

* cited by examiner

*Primary Examiner* — C Melissa Koslow
(74) *Attorney, Agent, or Firm* — Birch, Stewart, Kolasch & Birch, LLP

(57) ABSTRACT

The main object of the present invention is to provide a photosensitive resin composition with which a cured film that exhibits a high magnetic permeability real part μ' and a low magnetic loss tan δ in the high frequency region can be formed.

17 Claims, No Drawings

PHOTOSENSITIVE RESIN COMPOSITION, CURED FILM, INDUCTOR AND ANTENNA

CROSS-REFERENCE TO RELATED APPLICATIONS

This application is a Continuation of PCT International Application No. PCT/JP2020/011861 filed on Mar. 18, 2020, which claims priority under 35 U.S.C. § 119(a) to Japanese Patent Application No. 2019-067590 filed on Mar. 29, 2019. Each of the above applications is hereby expressly incorporated by reference, in its entirety, into the present application.

BACKGROUND OF THE INVENTION

1. Field of the Invention

The present invention relates to a photosensitive resin composition, a cured film, an inductor, and an antenna.

2. Description of the Related Art

In recent years, the frequency that is used in electronic communication instruments and the like has been rapidly increased. For example, in communication instruments such as a mobile phone, a high frequency band of 1 GHz or more is used, and there is an increasing demand for multiband support for responding to a plurality of communication methods. Along with this, for electronic components (for example, an inductor and an antenna) equipped in these instruments as well, a high frequency and a wide bandwidth are required strongly. A magnetic composite material obtained by dispersing magnetic particles in a dielectric material such as a resin is generally used for high-frequency electronic components.

As a composition with which a magnetic composite material can be formed, for example, JP4760709B discloses a photosensitive paste containing magnetic particles and a photosensitive organic component.

SUMMARY OF THE INVENTION

The inventors of the present invention prepared a photosensitive composition containing magnetic particles and a photosensitive organic component with reference to JP4760709B and examined a cured film obtained by exposing the photosensitive composition. As a result, the inventors of the present invention found that, particularly in the high frequency region (for example, 5 GHz), there is room for further improvement of the magnetic permeability real part µ' and the magnetic loss tan δ (in other words, particularly in the high frequency region, there is room for a further increase in the magnetic permeability real part µ' and a further decrease in the magnetic loss tan δ).

An object of the present invention to provide a photosensitive resin composition with which a cured film that exhibits a high magnetic permeability real part µ' and a low magnetic loss tan δ in the high frequency region can be formed.

Another object of the present invention is to provide a cured film that is formed by using the photosensitive resin composition and to provide an inductor and an antenna that contain the cured film.

As a result of diligent studies on the above problems, the inventors of the present invention have found that the above problems can be solved according to the following configurations, and have completed the present invention.

[1] A photosensitive resin composition comprising:
a resin that has an ethylenic unsaturated group and a graft chain, or a resin that has a compound having an ethylenic unsaturated group and has a graft chain;
an iron-containing particle of which an iron atom content is 10% by mass or more; and
a polymerization initiator.

[2] The photosensitive resin composition according to [1], in which in a case where the photosensitive resin composition is cured to form a cured film, the cured film has a magnetic permeability real part µ' of 1.5 or more at a frequency of 5 GHz and a magnetic loss tan δ of 0.05 or less at a frequency of 5 GHz.

[3] The photosensitive resin composition according to [1] or [2], in which in a case where the photosensitive resin composition is cured to form a cured film, the cured film has a magnetic permeability real part µ' of 1.5 or more at a frequency of 100 MHz and a magnetic loss tan δ of 0.05 or less at a frequency of 100 MHz.

[4] The photosensitive resin composition according to any one of [1] to [3], in which the iron-containing particle is an iron-cobalt alloy alloy particle.

[5] The photosensitive resin composition according to any one of [1] to [4], in which the iron-containing particle is an amorphous particle.

[6] The photosensitive resin composition according to any one of [1] to [5], in which a mass ratio of a content of the resin to a content of the iron-containing particle is 0.10 to 0.35.

[7] The photosensitive resin composition according to any one of [1] to [6], in which a particle diameter ratio T represented by Expression (A) is 1 to 3,
Expression (A): the particle diameter ratio T=an average particle diameter (µm) of the iron-containing particles in the photosensitive resin composition/an average primary particle diameter (µm) of the iron-containing particles.

[8] The photosensitive resin composition according to 141, in which an average primary particle diameter of the iron-containing particles is 0.01 to 0.20 µm.

[9] A cured film that is formed by curing the photosensitive resin composition according to any one of [1] to [8].

[10] The cured film according to [9], in which the cured film has a magnetic permeability real part µ' of 1.5 or more at a frequency of 5 GHz and a magnetic loss tan δ of 0.05 or less at a frequency of 5 GHz.

[11] The cured film according to [9] or [10], in which the cured film has a magnetic permeability real part µ' of 1.5 or more at a frequency of 100 MHz and a magnetic loss tan δ of 0.05 or less at a frequency of 100 MHz.

[12] An inductor comprising the cured film according to any one of [9] to [11].

[13] An antenna comprising the cured film according to any one of [9] to [11].

According to the present invention, it is possible to provide a photosensitive resin composition with which a cured film that exhibits a high magnetic permeability real part µ' and a low magnetic loss tan δ in the high frequency region can be formed.

Further, according to the present invention, it is possible to provide a cured film that is formed by using the photosensitive resin composition and to provide an inductor and an antenna that contain the cured film.

DESCRIPTION OF THE PREFERRED EMBODIMENTS

In the following description, the present invention will be described in more detail.

The explanation of the configuration requirements described below may be based on representative aspects of the invention; however, the present invention is not intended to be limited to such embodiments.

In describing a group (an atomic group) of the present specification, in a case where a description does not indicate substitution and non-substitution, the description means the group includes a group having a substituent as well as a group having no substituent unless contrary to the gist of the present invention. For example, the "alkyl group" includes not only an alkyl group that does not have a substituent (an unsubstituted alkyl group) but also an alkyl group that has a substituent (a substituted alkyl group). Further, the "organic group" in the present specification means a group containing at least one carbon atom.

In the present specification, the "actinic ray" or the "radiation" means, for example, a bright line spectrum of a mercury lamp, a far ultraviolet ray represented by an excimer laser, an extreme ultraviolet ray (an EUV ray), an X-ray, and an electron beam (EB). In the present specification, the "light" means an actinic ray or a radiation.

Unless otherwise specified, the "exposure" in the present specification includes not only the exposure with a bright line spectrum of a mercury lamp, a far ultraviolet ray represented by an excimer laser, an extreme ultraviolet ray, or an X-ray but also the drawing with a particle beams such as an electron beam or an ion beam.

In the present specification, the "to" is used to mean that numerical values described before and after "to" are included as a lower limit value and an upper limit value, respectively.

In the present specification, the (meth)acrylate represents acrylate and methacrylate, the (meth)acrylic represents acrylic and methacrylic, and the (meth)acryloyl represents acryloyl and methacryloyl.

Further, in the present specification, the weight-average molecular weight (Mw) is a polystyrene equivalent value obtained by a gel permeation chromatography (GPC) method.

[Photosensitive Resin Composition]

A photosensitive resin composition of the present invention (hereinafter, also referred to as a "composition") contains;

a resin (hereinafter, also referred to as a "resin BX") that has an ethylenic unsaturated group and a graft chain, or a resin (hereinafter, also referred to as a "resin BY") that has a compound having an ethylenic unsaturated group and has a graft chain, an iron-containing particle (hereinafter, also referred to as a "specific iron-containing particle") of which an iron atom content is 10% by mass or more, and a polymerization initiator.

That is, the composition of the present invention is a composition (hereinafter, also referred to as a "composition X") containing a resin BX, a specific iron-containing particle, and a polymerization initiator, or a composition (hereinafter, also referred to as a "composition Y") containing a compound having an ethylenic unsaturated group, a resin BY, a specific iron-containing particle, and a polymerization initiator.

According to the above configuration, it is possible to form a cured film that exhibits a high magnetic permeability real part μ' and a low magnetic loss tan δ in the high frequency region with the composition of the present invention.

The mechanism of action between the above configuration and the above effect is not necessarily clear; however, it is presumed as follows.

In the above composition, the resin BX and the resin BY are conceived to function as a good dispersing agent for the specific iron-containing particle due to a graft chain contained in the molecule. For this reason, in the above composition, it is presumed that the aggregation between the specific iron-containing particles and/or the aggregation between the specific iron-containing particle and another component hardly occurs and the specific iron-containing particles have an average particle diameter close to the value of the average primary particle diameter thereof. As a result, the cured film that is formed from the above composition is conceived to exhibit a high magnetic permeability real part μ' and a low magnetic loss tan δ in the high frequency region.

Hereinafter, first, the composition X of the present invention will be described.

[Composition X]

The composition X contains a resin BX, a specific iron-containing particle, and a polymerization initiator.

Hereinafter, the essential and optional components contained in the composition X will be described.

<Resin (Resin BX) that has Ethylenic Unsaturated Group and Graft Chain>

The composition X contains a resin (a resin BX) that has an ethylenic unsaturated group and a graft chain.

The content of the resin BX in the composition X is not particularly limited; however, it is preferably 2% to 40% by mass, more preferably 5% to 30% by mass, and still more preferably 10% to 20% by mass, with respect to the total solid content of the composition X.

One kind of the resin BX may be used alone, or two or more kinds thereof may be used in combination. In a case where two or more kinds of resins BX are used in combination, it is preferable that the total content is in the range described above.

The mass ratio (the content of the resin BX/the content of the specific iron-containing particle) of the content of the resin BX to the content of the specific iron-containing particle in the composition X is preferably 0.05 to 1.00, more preferably 0.10 to 0.35, and still more preferably 0.12 to 0.35.

(Ethylenic Unsaturated Group)

The resin BX contains an ethylenic unsaturated group. Since the resin BX contains an ethylenic unsaturated group, the composition X containing the resin BX exhibits more excellent pattern formation properties.

The ethylenic unsaturated group is not particularly limited; however, examples thereof include a (meth)acryloyl group, a vinyl group, and a styryl group, and a (meth)acryloyl group is preferable.

Among them, it is preferable that the resin BX contains a repeating unit containing an ethylenic unsaturated group in the side chain, and it is more preferable that the resin BX contains a repeating unit containing an ethylenic unsaturated group in the side chain and derived from (meth)acrylate (hereinafter, also referred to as a "(meth)acrylate-based repeating unit containing an ethylenic unsaturated group in the side chain"). The resin BX containing a (meth)acrylate-based repeating unit containing an ethylenic unsaturated group in the side chain is obtained, for example, by subjecting an ethylenically unsaturated compound containing a glycidyl group or an alicyclic epoxy group to an addition reaction with a carboxylic acid group in a resin containing the carboxylic acid group such as a repeating unit derived from (meth)acrylic acid.

In a case where the resin BX contains a repeating unit containing an ethylenic unsaturated group, the content thereof is preferably 30% to 70% by mass and more preferably 40% to 60% by mass with respect to the total mass of the resin BX in terms of mass. In a case where the content of the repeating unit containing an ethylenic unsaturated group is in the above range, better pattern formation properties are exhibited.

(Repeating Unit Containing Graft Chain)

The resin BX preferably contains a repeating unit containing a graft chain.

The longer the graft chain, the higher the steric repulsion effect and the better the dispersibility of the specific iron-containing particle. On the other hand, in a case where the graft chain is too long, the adsorption power to the specific iron-containing particle decreases, and thus the dispersibility of the specific iron-containing particle tends to decrease. For this reason, the graft chain preferably has 40 to 10,000 atoms excluding hydrogen atoms, more preferably 50 to 2,000 atoms excluding hydrogen atoms, and still more preferably 60 to 500 atoms excluding hydrogen atoms.

Here, the graft chain indicates from the root (the atom bonded to the main chain in a group branched from the main chain) of the main chain to the terminal of a group branched from the main chain.

Further, the graft chain preferably contains a polymer structure, and examples of such a polymer structure include a poly(meth)acrylate structure (for example, a poly(meth) acrylic structure), a polyester structure, a polyurethane structure, a polyurea structure, a polyamide structure, and a polyether structure.

In order to increase the dispersibility of the specific iron-containing particles by improving the interactivity between a graft chain and a solvent, the graft chain is preferably a graft chain containing at least one selected from the group consisting of a polyester structure, a polyether structure, and a poly(meth)acrylate structure, and is more preferably a graft chain containing at least any one of a polyester structure or a polyether structure.

The macromonomer (a monomer having a polymer structure and binding to the main chain to form a graft chain) containing such a graft chain is not particularly limited; however, a macromonomer containing a reactive double bond group is suitably used.

As the commercially available macromonomer that corresponds to the repeating unit containing the graft chain and is suitably used for the synthesis of the resin BX, the followings are used: AA-6, AA-10. AB-6, AS-6, AN-6, AW-6, AA-714, AY-707, AY-714, AK-5, AK-30, and AK-32 (all trade names, manufactured by Toagosei Co., Ltd.); and Blemmer PP-100, Blemmer PP-500. Blemmer PP-800, Blemmer PP-1000, Blemmer 55-PET-800, Blemmer PME-4000, Blemmer PSE-400, Blemmer PSE-1300, and Blemmer 43 PAPE-600B (all trade names, manufactured by NOF Corporation). Among them, AA-6, AA-10, AB-6, AS-6, AN-6, or Blemmer PME-4000 is preferable.

The resin BX preferably contains at least one structure selected from the group consisting of poly(methyl acrylate), poly(methyl methacrylate), and a cyclic or linear polyester, more preferably contains at least one structure selected from the group consisting of poly(methyl acrylate), poly(methyl methacrylate), and a linear polyester, and still more preferably contains at least one structure selected from the group consisting of a poly(methyl acrylate) structure, a poly(methyl methacrylate) structure, a polycaprolactone structure, and a polyvalerolactone structure. The resin BX may contain one of the above structures alone or may contain a plurality of these structures.

Here, the polycaprolactone structure refers to a structure containing a decyclized structure of ε-caprolactone as the repeating unit. The polyvalerolactone structure refers to a structure containing a decyclized structure of δ-valerolactone as the repeating unit.

In a case where the resin BX contains a repeating unit in which j and k in Formula (1) and Formula (2) described later are 5, the above-described polycaprolactone structure can be introduced into the resin BX.

In addition, in a case where the resin BX contains a repeating unit in which j and k in Formula (1) and Formula (2) described later are 4, the above-described polyvalerolactone structure can be introduced into the resin BX.

In addition, in a case where the resin BX contains a repeating unit in which $X^5$ in Formula (4) described later is a hydrogen atom and $R^4$ is a methyl group, the above-described poly(methyl acrylate) structure can be introduced into the resin BX.

In addition, in a case where the resin BX contains a repeating unit in which $X^5$ in Formula (4) described later is a methyl group and $R^4$ is a methyl group, the above-described poly(methyl methacrylate) structure can be introduced into the resin BX.

The resin BX preferably contains a repeating unit represented by any of Formula (1) to Formula (4) as the repeating unit containing a graft chain, and more preferably contains a repeating unit represented by any of Formula (1A), Formula (2A), Formula (3A), Formula (3B), and Formula (4).

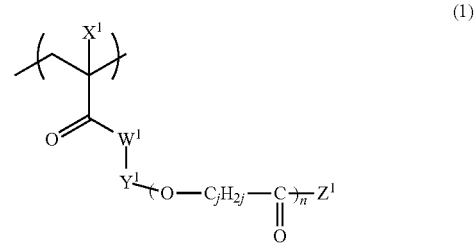

(1)

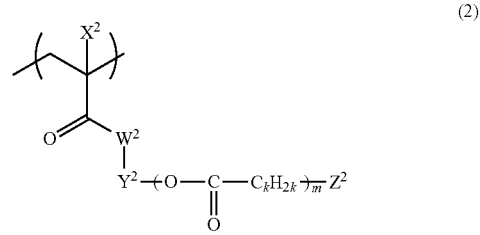

(2)

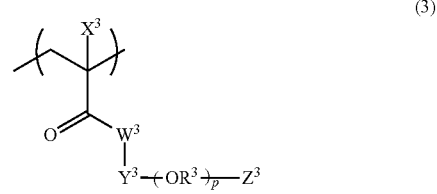

(3)

(4)

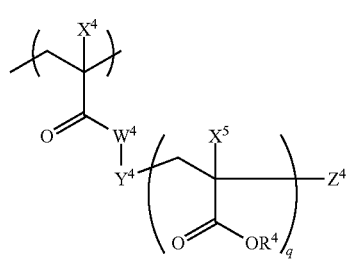

In Formulae (1) to (4), $W^1$, $W^2$, $W^3$, and $W^4$ each independently represent an oxygen atom or NH. $W^1$, $W^2$, $W^3$, and $W^4$ are preferably an oxygen atom.

In Formulae (1) to (4), $X^1$, $X^2$, $X^3$, $X^4$, and $X^5$ each independently represent a independently preferably a hydrogen atom or an alkyl group having 1 to 12 carbons (carbon atoms), each independently more preferably a hydrogen atom or a methyl group, and still more preferably a methyl group, from the viewpoint of synthetic restriction.

In Formulae (1) to (4), $Y^1$, $Y^2$, $Y^3$, and $Y^4$ each independently represent a divalent linking group, and the linking group is not particularly limited structurally. Specific examples of the divalent linking group represented by $Y^1$, $Y^2$, $Y^3$, and $Y^4$ include linking groups (Y-1) to (Y-21) shown below. In the structures shown below, A and B mean the binding sites to the left-terminal group and the right-terminal group, respectively, in Formulae (1) to (4). Among the structures shown below, (Y-2) or (Y-13) is more preferable due to the ease of synthesis.

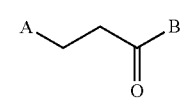
(Y-1)

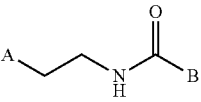
(Y-2)

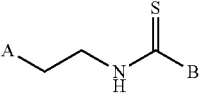
(Y-3)

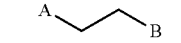
(Y-4)

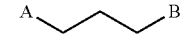
(Y-5)

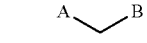
(Y-6)

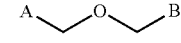
(Y-7)

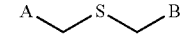
(Y-8)

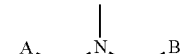
(Y-9)

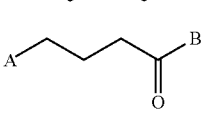
(Y-10)

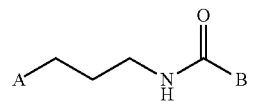
(Y-11)

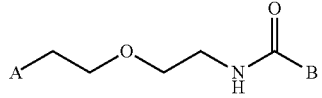
(Y-12)

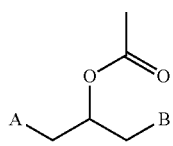
(Y-13)

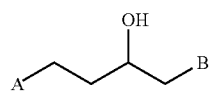
(Y-14)

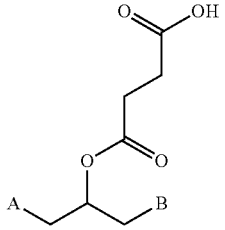
(Y-15)

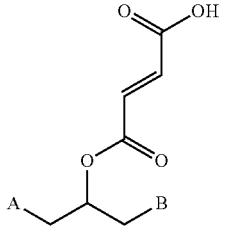
(Y-16)

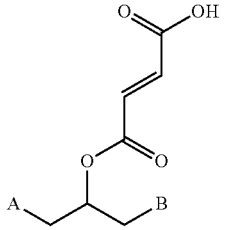
(Y-17)

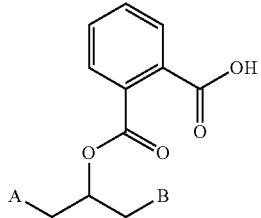
(Y-18)

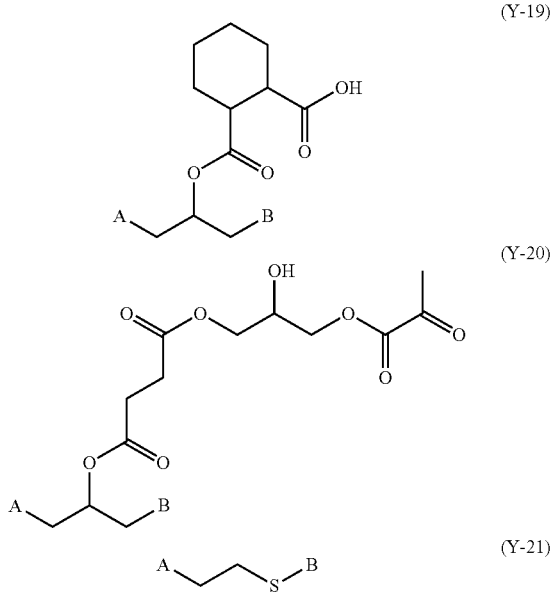

(Y-19)

(Y-20)

(Y-21)

In Formulae (1) to (4), $Z^1$, $Z^2$, $Z^3$, and $Z^4$ each independently represent a monovalent organic group. The structure of the organic group is not particularly limited; however, specific examples thereof include an alkyl group, a hydroxyl group, an alkoxy group, an aryloxy group, a heteroaryloxy group, an alkylthioether group, an arylthioether group, a heteroarylthioether group, and an amino group. Among these, particularly from the viewpoint of improving dispersibility, it is preferable that the organic group represented by $Z^1$, $Z^2$, $Z^3$, and $Z^4$ is a group having a steric repulsion effect, where it is more preferable that Z1, Z2, Z3, and Z4 are each independently an alkyl group or alkoxy group having 5 to 24 carbon atoms, and particularly, it is still more preferable that, among the above. Z1, Z2, Z3, and Z4 are each independently a branched alkyl group having 5 to 24 carbon atoms, a cyclic alkyl group having 5 to 24 carbon atoms, or an alkoxy group having 5 to 24 carbon atoms. The alkyl group contained in the alkoxy group may be linear, branched, or cyclic.

In Formulae (1) to (4), n, m, p, and q are each independently an integer of 1 to 500.

In addition, in the Formulae (1) and (2), j and k each independently represent an integer of 2 to 8. j and k in Formulae (1) and (2) are preferably an integer of 4 to 6 and more preferably 5 from the viewpoint of the temporal stability and the developability of the composition.

In addition, in Formulae (1) and (2), n and m are preferably an integer of 10 or more and more preferably an integer of 20 or more. Further, in a case where the resin BX contains a polycaprolactone structure and a polyvalerolactone structure, the sum of the number of repetitions of the polycaprolactone structure and the number of repetitions of the polyvalerolactone structure is preferably an integer of 10 or more and is more preferably an integer of 20 or more.

In Formula (3), $R^3$ represents a branched or linear alkylene group, is preferably an alkylene group having 1 to 10 carbon atoms, and is more preferably an alkylene group having 2 or 3 carbon atoms. In a case where p is 2 to 500, a plurality of R's may be the same or different from each other.

In Formula (4). $R^4$ represents a hydrogen atom or a monovalent organic group, and the structure of this monovalent organic group is not particularly limited. $R^4$ is preferably a hydrogen atom, an alkyl group, an aryl group, or a heteroaryl group and is more preferably a hydrogen atom or an alkyl group. In a case where $R^4$ is an alkyl group, the alkyl group is preferably a linear alkyl group having 1 to 20 carbon atoms, a branched alkyl group having 3 to 20 carbon atoms, or a cyclic alkyl group having 5 to 20 carbon atoms, more preferably a linear alkyl group having 1 to 20 carbon atoms, and still more preferably a linear alkyl group having 1 to 6 carbon atoms. In Formula (4), in a case where q is 2 to 500, a plurality of X's and $R^4$'s in the graft chain may be the same or different from each other.

In addition, the resin BX may contain two or more kinds of repeating units containing a graft chain, where the repeating units have structures different from each other. That is, repeating units represented by Formulae (1) to (4), which have structures different from each other, may be contained in the molecule of the resin BX, and in a case where n, m, p, and q in Formulae (1) to (4) each represent an integer of 2 or more, a structure in which j and k are different from each other may be contained in the side chain in Formulae (1) and (2), and a plurality of $R^3$'s, $R^4$'s, and $X^5$'s in the molecule may be the same or different from each other in Formulae (3) and (4).

The repeating unit represented by Formula (1) is more preferably a repeating unit represented by Formula (1A) from the viewpoint of the temporal stability and the developability of the composition.

In addition, the repeating unit represented by Formula (2) is more preferably a repeating unit represented by Formula (2A) from the viewpoint of the temporal stability and the developability of the composition.

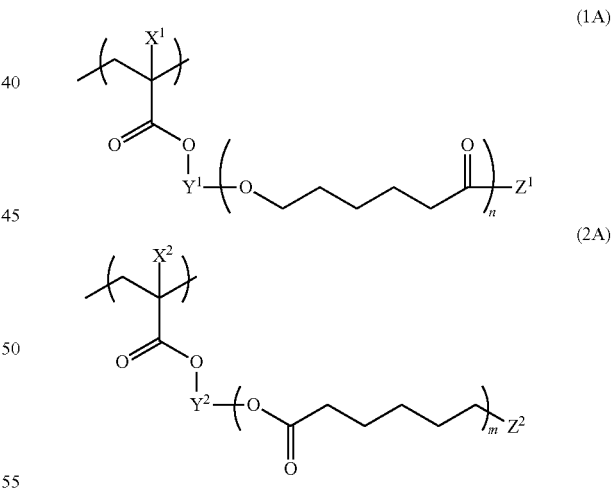

(1A)

(2A)

In Formula (1A), $X^1$, $Y^2$, $Z^1$, and n are respectively synonymous with $X^1$, $Y^1$, $Z^1$, and n in Formula (1), and the same applies to the preferred ranges thereof. In Formula (2A), $X^2$, $Y^2$, $Z^2$, and m are respectively synonymous with $X^2$, $Y^2$, $Z^2$, and m in Formula (2), and the same applies to the preferred ranges thereof.

In addition, the repeating unit represented by Formula (3) is more preferably a repeating unit represented by Formula (3A) or Formula (3B) from the viewpoint of the temporal stability and the developability of the composition.

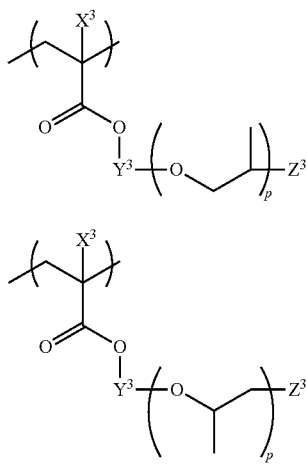

(3A)

(3B)

In Formula (3A) or (3B), $X^3$, $Y^3$, $Z^3$, and p are respectively synonymous with $X^3$, $Y^3$, $Z^3$, and p in Formula (3), and the same applies to the preferred ranges thereof.

The resin BX more preferably contains a repeating unit represented by Formula (1A) as the repeating unit containing a graft chain.

It is also preferable that the resin BX contains a repeating unit containing a polyalkylene imine structure and a polyester structure. It is preferable that the repeating unit containing a polyalkylene imine structure and a polyester structure contains the polyalkylene imine structure in the main chain and has the polyester structure as a graft chain.

The polyalkylene imine structure is a polymerization structure containing two or more identical or different alkylene imine chains. Specific examples of the alkylene imine chain include alkylene imine chains represented by Formula (4A) and Formula (4B).

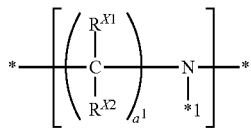

(4A)

In Formula (4A), $R^{X1}$ and $R^{X2}$ each independently represent a hydrogen atom or an alkyl group. $a^1$ represents an integer of 2 or more. N* represents a bonding position to a polyester chain, an adjacent alkylene imine chain, or to a hydrogen atom or a substituent.

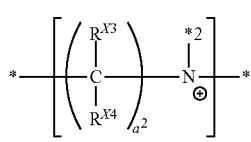

(4B)

In Formula (4B), $R^{X3}$ and $R^{X4}$ each independently represent a hydrogen atom or an alkyl group. $a^2$ represents an integer of 2 or more. N+ specified in Formula (4B) and an anionic group contained in a polyester chain form a salt-crosslinked group, whereby an alkylene imine chain represented by Formula (4B) is bonded to the polyester chain having an anionic group.

* in Formula (4A) and Formula (4B) and *² in Formula (4B) each independently represent a position where an adjacent alkylene imine chain, or a hydrogen atom or a substituent is bonded.

Among the above, it is preferable that * in Formula (4A) and Formula (4B) represents a position where an adjacent alkylene imine chain is bonded.

$R^{X1}$ and $R^{X2}$ in Formula (4A) and $R^{X1}$ and $R^{X4}$ in Formula (4B) each independently represent a hydrogen atom or an alkyl group.

The alkyl group preferably has 1 to 6 carbon atoms and more preferably 1 to 3 carbon atoms.

In Formula (4A), both $R^{X1}$ and $R^{X2}$ are preferably a hydrogen atom.

In Formula (4B), both $R^{X1}$ and $R^{X4}$ are preferably a hydrogen atom.

$a^1$ in Formula (4A) and $a^2$ in Formula (4B) are not particularly limited as long as they are an integer of 2 or more. The upper limit thereof is preferably 10 or less, more preferably 6 or less, still more preferably 4 or less, even still more preferably 2 or 3, and particularly preferably 2.

In Formula (4A) and Formula (4B), * represents a bonding position to a polyester chain, an adjacent alkylene imine chain, or to a hydrogen atom or a substituent.

Examples of the substituent include a substituent such as an alkyl group (for example, an alkyl group having 1 to 6 carbon atoms). Further, a polyester chain may be bonded as the substituent.

The alkylene imine chain represented by Formula (4A) is preferably connected to a polyester chain at the position of *¹ described above. Specifically, it is preferable that the carbonyl carbon in the polyester chain is bonded at the position of *¹ described above.

Examples of the polyester chain include a polyester chain represented by Formula (5A).

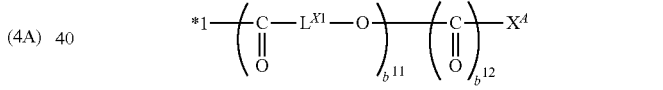

(5A)

In a case where the alkylene imine chain is an alkylene imine chain represented by Formula (4B), it is preferable that the polyester chain contains an anionic group (preferably, oxygen anion O⁻), and this anionic group and N⁺ in Formula (4B) form a salt-crosslinked group.

Examples of such a polyester chain include a polyester chain represented by Formula (5B).

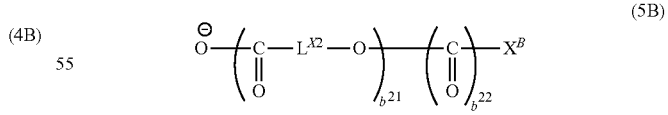

(5B)

$L^{X1}$ in Formula (5A) and $L^{X2}$ in Formula (5B) each independently represent a divalent linking group. The divalent linking group preferably includes an alkylene group having 3 to 30 carbon atoms.

$b^{11}$ in Formula (5A) and $b^{21}$ in Formula (5B) each independently represent an integer of 2 or more, and the upper limit thereof is, for example, 200 or less.

$b^{12}$ in Formula (5A) and $b^{22}$ in Formula (5B) each independently represent 0 or 1.

$X^A$ in Formula (5A) and $X^B$ in Formula (5B) each independently represent a hydrogen atom or a substituent. Examples of the substituent include an alkyl group, an alkoxy group, a polyalkyleneoxyalkyl group, and an aryl group.

Examples of the number of carbon atoms of the alkyl group (which may be linear, branched, or cyclic) and the alkyl group contained in the alkoxy group (which may be linear, branched, or cyclic) include 1 to 30, and 1 to 10 are preferable. In addition, the alkyl group may further have a substituent, and examples of the substituent include a hydroxyl group and a halogen atom (the halogen atom includes a fluorine atom, a chlorine atom, a bromine atom, an iodine atom, and the like).

The poly alkyleneoxyalkyl group is a substituent represented by $R^{X6}(OR^{X7})_p(O)_q$—. $R^{X6}$ represents an alkyl group, $R^{X7}$ represents an alkylene group, p represents an integer of 2 or more, and q represents 0 or 1.

The alkyl group represented by $R^{X1}$ is synonymous with the alkyl group represented by $X^A$. In addition, Examples of the alkylene group represented by $R^{X7}$ include a group obtained by removing one hydrogen atom from the alkyl group represented by $X^A$.

p is an integer of 2 or more, and the upper limit value thereof is, for example, 10 or less and is preferably 5 or less.

Examples of the aryl group (which may be monocyclic or polycyclic) include an aryl group having 6 to 24 carbon atoms.

The aryl group may further have a substituent, and examples of the substituent include an alkyl group, a halogen atom, and a cyano group.

The polyester chain preferably has a decyclized structure of a lactone such as ε-caprolactone, δ-caprolactone, β-propiolactone, γ-butyrolactone, δ-valerolactone, γ-valerolactone, enantholactone, β-butyrolactone, γ-hexanolactone, γ-octanolactone, δ-hexanolactone, δ-octanolactone, δ-dodecanolactone, α-methyl-γ-butyrolactone, or lactide (which may be an L-form or a D-form), and more preferably a decyclized structure of ε-caprolactone or δ-valerolactone.

The repeating unit containing the polyalkylene imine structure and the polyester structure can be synthesized according to the synthesis method described in JP5923557B.

In the resin BX, the content of the repeating unit containing a graft chain is preferably 2% to 95% by mass, more preferably 2% to 90% by mass, and particularly preferably 5% to 30% by mass, with respect to the total mass of the resin BX in terms of mass. In a case where the repeating unit containing a graft chain is contained in this range, the specific iron-containing particle has high dispersibility, and further, the developability in the formation of a cured film is good.

(Hydrophobic Repeating Unit)

In addition, the resin BX preferably contains a hydrophobic repeating unit that is different (that is, does not correspond to the repeating unit containing a graft chain) from the repeating unit containing a graft chain. However, in the present specification, the hydrophobic repeating unit is a repeating unit having no acid group (for example, a carboxylic acid group, a sulfonic acid group, a phosphoric acid group, or a phenolic hydroxyl group).

The hydrophobic repeating unit is preferably a repeating unit derived from (corresponding to) a compound (a monomer) having a ClogP value of 1.2 or more and is more preferably a repeating unit derived from a compound having a ClogP value of 1.2 to 8. This makes it possible to exhibit the effects of the present invention more reliably.

The ClogP value is a value calculated by a program "CLOGP" that can be available from Daylight Chemical Information System, Inc. This program provides a value of the "calculated log P", calculated by the fragment approach (see the documents below) by Hansch and Leo. In the fragment approach that is based on the chemical structure of a compound, the chemical structure is divided into partial structures (fragments), and then the extents of contribution to log P respectively assigned to the fragments are summed to estimate the log P value of the compound. The details are described in the following documents. In the present specification, a ClogP value calculated by the program CLOGP v4.82 is used.

A. J. Leo, Comprehensive Medicinal Chemistry, Vol. 4, C. Hansch, P. G. Sammnens, J. B. Taylor, and C. A. Ramsden, Eds., p. 295, Pergamon Press, 1990, C. Hansch & A. J. Leo, Substituent Constants for Correlation Analysis in Chemistry and Biology. John Wiley & Sons, A. J. Leo, Calculating log Poct from structure. Chem. Rev., 93, 1281 to 1306, 1993.

The log P means the common logarithm of the partition coefficient P, is a physical property value which is represented as a quantitative numerical value and which indicates how an organic compound is distributed in the equilibrium of a two-phase system of oil (generally 1-octanol) and water, and is expressed by the following expression.

$$\log P = \log(\text{Coil}/\text{Cwater})$$

In the expression, Coil represents the molar concentration of a compound in the oil phase, and Cwater represents the molar concentration of the compound in the water phase.

In a case where a log P value increases positively across 0, oil solubility increases, and in a case where the absolute value increases negatively, water solubility increases. There is a negative correlation between the log P value and the water solubility of organic compounds, and thus the log P value is widely used as a parameter for estimating the hydrophilicity and hydrophobicity of an organic compound.

The resin BX preferably contains, as the hydrophobic repeating unit, one or more repeating units selected from repeating units derived from monomers represented by Formulae (i) to (iii).

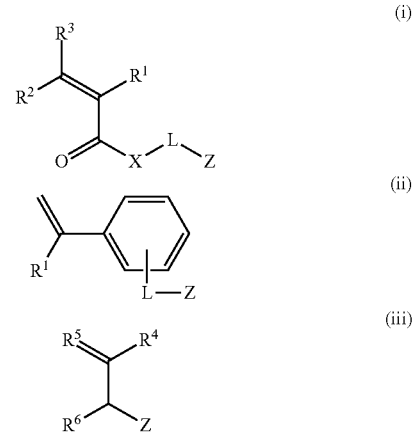

In Formulae (i) to (iii), $R^1$, $R^2$, and $R^3$ each independently represents a hydrogen atom, a halogen atom (for example, a fluorine atom, a chlorine atom, or a bromine atom), or an alkyl group having 1 to 6 carbon atoms (for example, a methyl group, an ethyl group, or a propyl group).

$R^1$, $R^2$, and $R^3$ are preferably a hydrogen atom or an alkyl group having 1 to 3 carbon atoms and more preferably a hydrogen atom or a methyl group. It is still more preferable that $R^2$ and $R^3$ are a hydrogen atom.

X represents an oxygen atom (—O—) or an imino group (—NH—) and is preferably an oxygen atom.

L is a single bond or a divalent linking group. Examples of the divalent linking group include a divalent aliphatic group (for example, an alkylene group, a substituted alkylene group, an alkenylene group, a substituted alkenylene group, an alkynylene group, or a substituted alkynylene group) a divalent aromatic group (for example an arylene group or a substituted arylene group), a divalent heterocyclic group, an oxygen atom (—O—), a sulfur atom (—S—), an imino group (—NH—), a substituted imino group (—$NR^{31}$—, where $R^{31}$ is an aliphatic group, an aromatic group, or a heterocyclic group), a carbonyl group (—CO—), and a combination thereof.

The divalent aliphatic group may have a cyclic structure or a branched structure. The aliphatic group preferably has 1 to 20 carbon atoms, more preferably 1 to 15 carbon atoms, and still more preferably 1 to 10 carbon atoms. The aliphatic group may be an unsaturated aliphatic group or a saturated aliphatic group; however, it is preferably a saturated aliphatic group. In addition, the aliphatic group may have a substituent. Examples of the substituent include a halogen atom, an aromatic group, and a heterocyclic group.

The divalent aromatic group preferably has 6 to 20 carbon atoms, more preferably 6 to 15 carbon atoms, and still more preferably 6 to 10 carbon atoms. In addition, the aromatic group may have a substituent. Examples of the substituent include a halogen atom, an aliphatic group, an aromatic group, and a heterocyclic group.

The divalent heterocyclic group preferably contains a 5-membered ring or a 6-membered ring as the heterocyclic ring. Another heterocyclic ring, an aliphatic ring, or an aromatic ring may be condensed with the heterocyclic ring. In addition, the heterocyclic group may have a substituent. Examples of the substituent include a halogen atom, a hydroxyl group, an oxo group (=O), a thioxo group (=S), an imino group (=NH), a substituted imino group (=N—$R^{32}$, where $R^{32}$ is an aliphatic group, an aromatic group, or a heterocyclic group), an aliphatic group, an aromatic group, and a heterocyclic group.

L is preferably a single bond, an alkylene group, or a divalent linking group containing an oxyalkylene structure. The oxyalkylene structure is more preferably an oxyethylene structure or an oxypropylene structure. Further, L may contain a polyoxyalkylene structure in which two or more oxyalkylene structures are repeated. The polyoxyalkylene structure is preferably a polyoxyethylene structure or a polyoxypropylene structure. The polyoxyethylene structure is represented by —$(OCH_2CH_2)_n$—, where n is preferably an integer of 2 or more and more preferably an integer of 2 to 10.

Examples of the Z include an aliphatic group (for example, an alkyl group, a substituted alkyl group, an unsaturated alkyl group, or a substituted unsaturated alkyl group), an aromatic group (for example, an aryl group, a substituted aryl group, an arylene group, or a substituted arylene group), a heterocyclic group, and a combination thereof. These groups may contain an oxygen atom (—O—), a sulfur atom (—S—), an imino group (—NH—), a substituted imino group (—$NR^{31}$—, where $R^{31}$ is an aliphatic group, an aromatic group, or a heterocyclic group), or a carbonyl group (—CO—).

The aliphatic group may have a cyclic structure or a branched structure. The aliphatic group preferably has 1 to 20 carbon atoms, more preferably 1 to 15 carbon atoms, and still more preferably 1 to 10 carbon atoms. The aliphatic group further includes a ring assembly hydrocarbon group or a crosslinked cyclic hydrocarbon group. Examples of the ring assembly hydrocarbon group include a bicyclohexyl group, a perhydronaphthalenyl group, a biphenyl group, and a 4-cyclohexylphenyl group. Examples of the crosslinked cyclic hydrocarbon ring include bicyclic hydrocarbon rings such as pinane, bornane, norpinane, norbornane, and a bicyclooctane ring (a bicyclo[2.2.2]octane ring, a bicyclo[3.2.1]octane ring, or the like), tricyclic hydrocarbons such as homobredane, adamantane, a tricyclo[5.2.1.0$^{2,6}$]decane ring, and a tricyclo[4.3.1.1$^{2,5}$]undecane ring, and tetracyclic hydrocarbon rings such as a tetracyclo[4.4.0.1$^{2,5}$1$^{7,10}$]dodecane ring and a perhydro-1,4-methano-5,8-methanonaphthalene ring. In addition, the crosslinked cyclic hydrocarbon ring also includes a fused ring-type hydrocarbon ring, for example, a fused ring obtained by fusing a plurality of 5-membered to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring, and a perhydrophenalene ring.

As the aliphatic group, a saturated aliphatic group is preferable to an unsaturated aliphatic group. In addition, the aliphatic group may have a substituent. Examples of the substituent include a halogen atom, an aromatic group, and a heterocyclic group. However, the aliphatic group does not have an acid group as the substituent.

The aromatic group preferably has 6 to 20 carbon atoms, more preferably 6 to 15 carbon atoms, and still more preferably 6 to 10 carbon atoms. In addition, the aromatic group may have a substituent. Examples of the substituent include a halogen atom, an aliphatic group, an aromatic group, and a heterocyclic group. However, the aromatic group does not have an acid group as the substituent.

The heterocyclic group preferably contains a 5-membered ring or a 6-membered ring as the heterocyclic ring. Another heterocyclic ring, an aliphatic ring, or an aromatic ring may be condensed with the heterocyclic ring. In addition, the heterocyclic group may have a substituent. Examples of the substituent include a halogen atom, a hydroxyl group, an oxo group (=O), a thioxo group (=S), an imino group (=NH), a substituted imino group (=N—$R^{32}$, where $R^{12}$ is an aliphatic group, an aromatic group, or a heterocyclic group), an aliphatic group, an aromatic group, and a heterocyclic group. However, the heterocyclic group does not have an acid group as the substituent.

In Formula (iii), $R^4$, $R^5$, and $R^6$ each independently represents a hydrogen atom, a halogen atom (for example, a fluorine atom, a chlorine atom, or a bromine atom), an alkyl group having 1 to 6 carbon atoms (for example, a methyl group, an ethyl group, or a propyl group), Z, or L-Z. Here, L and Z are synonymous with L and Z described above. $R^4$, $R^5$, and $R^6$ are preferably a hydrogen atom or an alkyl group having 1 to 3 carbon atoms and more preferably a hydrogen atom.

The monomer represented by Formula (i) is preferably a compound in which $R^1$, $R^2$, and $R^3$ are a hydrogen atom or a methyl group, L is a single bond or a divalent linking group containing an alkylene group or an oxyalkylene structure, X is an oxygen atom or an imino group, and Z is an aliphatic group, a heterocyclic group, or an aromatic group.

In addition, the monomer represented by Formula (ii) is preferably a compound in which $R^1$ is a hydrogen atom or a methyl group. L is an alkylene group, and Z is an aliphatic group, a heterocyclic group, or an aromatic group. In addition, the monomer represented by Formula (iii) is preferably a compound in which $R^4$, $R^5$, and $R^6$ are a hydrogen atom or a methyl group, and Z is an aliphatic group, a heterocyclic group, or an aromatic group.

Examples of the representative compound represented by Formulae (i) to (iii) include radically polymerizable compounds selected from acrylic acid esters, methacrylic acid esters, or styrenes.

As the examples of the representative compound represented by Formulae (i) to (iii), the compounds described in paragraphs 0089 to 0093 of JP2013-249417A can be referred to, and the content thereof is incorporated in the present specification.

In the resin BX, the content of the hydrophobic repeating unit is preferably 10% to 90% by mass and more preferably 20% to 80% by mass with respect to the total mass of the resin BX in terms of mass. Satisfactory pattern formation properties can be obtained in a case where the content is in the above range.

(Functional Group Capable of Forming Interaction with Specific Iron-Containing Particle)

A functional group capable of forming an interaction with the specific iron-containing particle can be introduced into the resin BX. Here, the resin BX preferably further contains a repeating unit that contains a functional group capable of forming an interaction with the specific iron-containing particle.

Examples of the functional group capable of forming an interaction with the specific iron-containing particle include an acid group, a basic group, a coordinating group, and a functional group having reactivity.

In a case of containing an acid group, a basic group, a coordinating group, or a functional group having reactivity, the resin BX preferably contains a repeating unit containing an acid group, a repeating unit containing a basic group, a repeating unit containing a coordinating group, or a repeating unit having reactivity.

In particular, in a case where the resin BX further contains an alkali-soluble group such as a carboxylic acid group, as the acid group, it is possible to impart the developability for pattern formation by the alkali developing to the resin BX.

That is, in a case where an alkali-soluble group is introduced into the resin BX, the resin BX as a dispersing agent that contributes to the dispersion of the specific iron-containing particles has alkali-solubility in the above composition. In the composition containing such a resin BX, the alkali developability of an unexposed part is improved.

Further, in a case where the resin BX contains a repeating unit containing an acid group, the resin BX becomes more compatible with a solvent and the coatability tends to be improved.

This presumed to be because the acid group in the repeating unit containing an acid group easily interacts with the specific iron-containing particle, the resin BX stably disperses the specific iron-containing particles, the viscosity of the resin BX that disperses the specific iron-containing particles is low, and thus the resin BX itself is easily dispersed stably.

Here, the repeating unit containing an alkali-soluble group as the acid group may be the same repeating unit as the repeating unit containing a graft chain described above or may be a repeating unit different therefrom; however, the repeating unit containing an alkali-soluble group as the acid group is a repeating unit different from the hydrophobic repeating unit described above (that is, does not correspond to the hydrophobic repeating unit described above).

Examples of the acid group that is a functional group capable of forming an interaction with the specific iron-containing particle include a carboxylic acid group, a sulfonic acid group, a phosphoric acid group, and a phenolic hydroxyl group, at least one of a carboxylic acid group, a sulfonic acid group, or a phosphoric acid group is preferable, and a carboxylic acid group is more preferable. The carboxylic acid group has good adsorption power to the specific iron-containing particle and high dispersibility.

That is, the resin BX preferably further contains a repeating unit containing at least one of a carboxylic acid group, a sulfonic acid group, or a phosphoric acid group.

The resin BX may have one or more repeating units containing an acid group. In a case where the resin BX contains a repeating unit containing an acid group, the content thereof is preferably 5% to 80% by mass and more preferably 10% to 60% by mass with respect to the total mass of the resin BX in terms of mass.

Examples of the basic group that is a functional group capable of forming an interaction with the specific iron-containing particle include a primary amino group, a secondary amino group, a tertiary amino group, a heterocycle containing an N atom, and an amide group. The preferred basic group is a tertiary amino group from the viewpoint that the adsorption power to the specific iron-containing particle is good and the dispersibility is high. The resin BX may contain one or more of these basic groups.

In a case where the resin BX contains a repeating unit containing a basic group, the content thereof is preferably 0.01% to 50% by mass and more preferably 0.01% to 30% by mass with respect to the total mass of the resin BX in terms of mass.

Examples of the coordinating group that is a functional group capable of forming an interaction with the specific iron-containing particle and examples of the functional group having reactivity include an acetylacetoxy group, a trialkoxysilyl group, an isocyanate group, an acid anhydride, and an acid chloride. The preferred functional group is an acetylacetoxy group from the viewpoint that the adsorption power to the specific iron-containing particle is good and the dispersibility of the specific iron-containing particle is high. The resin BX may have one or more of these groups.

In a case where the resin BX contains a repeating unit containing a coordinating group or a repeating unit containing a functional group having reactivity, the content thereof is preferably 10% to 80% by mass and more preferably 20% to 60% by mass with respect to the total mass of the resin BX in terms of mass.

In a case of containing a functional group capable of forming an interaction with the specific iron-containing particle, other than the graft chain, the resin BX may contain a functional group capable of forming an interaction with the various specific iron-containing particles described above, and it is not particularly limited how this functional group is introduced; however, the resin BX preferably contains one or more repeating units selected from repeating units derived from monomers represented by Formulae (iv) to (vi).

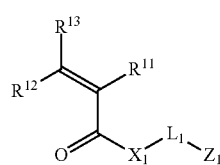

(iv)

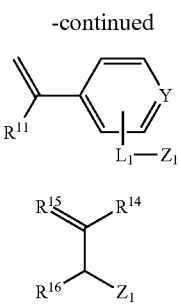

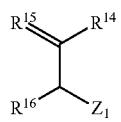

In Formulae (iv) to (vi), $R^{11}$, $R^{12}$, and $R^{13}$ each independently represent a hydrogen atom, a halogen atom (for example, a fluorine atom, a chlorine atom, or a bromine atom), or an alkyl group having 1 to 6 carbon atoms (for example, a methyl group, an ethyl group, or a propyl group).

In Formulae (iv) to (vi), $R^{11}$, $R^{12}$, and $R^{13}$ are preferably a hydrogen atom or an alkyl group having 1 to 3 carbon atoms and more preferably a hydrogen atom or a methyl group. In Formula (iv), $R^{12}$ and $R^{13}$ are still more preferably a hydrogen atom.

$X^1$ in Formula (iv) represents an oxygen atom (—O—) or an imino group (—NH—) and is preferably an oxygen atom.

In addition, Y in Formula (v) represents a methine group or a nitrogen atom.

Further, $L_1$ in Formulae (iv) and (v) represents a single bond or a divalent linking group. The definition of the divalent linking group is the same as the definition of the divalent linking group represented by L in Formula (i).

$L_1$ is preferably a single bond, an alkylene group, or a divalent linking group containing an oxyalkylene structure. The oxyalkylene structure is more preferably an oxyethylene structure or an oxypropylene structure. Further, $L_1$ may contain a polyoxyalkylene structure in which two or more oxyalkylene structures are repeated. The polyoxyalkylene structure is preferably a polyoxyethylene structure or a polyoxypropylene structure. The polyoxyethylene structure is represented by —$(OCH_2CH_2)_n$—, where n is preferably an integer of 2 or more and more preferably an integer of 2 to 10.

In Formulae (iv) to (vi), $Z_1$ represents a functional group other than the graft chain, which is capable of forming an interaction with the specific iron-containing particle, is preferably a carboxylic acid group or a tertiary amino group, and is more preferably a carboxylic acid group.

In Formula (vi), $R^{14}$, $R^{15}$, and $R^{16}$ each independently represents a hydrogen atom, a halogen atom (for example, a fluorine atom, a chlorine atom, or a bromine atom), an alkyl group having 1 to 6 carbon atoms (for example, a methyl group, an ethyl group, or a propyl group), —$Z_1$, or $L_1$-$Z_1$. Here, $L_1$ and $Z_1$ are respectively synonymous with $L_1$ and $Z_1$ described above, and the same applies to preferred examples thereof. $R^{14}$, $R^{15}$, and $R^{16}$ are preferably a hydrogen atom or an alkyl group having 1 to 3 carbon atoms and more preferably a hydrogen atom.

The monomer represented by Formula (iv) is preferably a compound in which $R^{11}$, $R^{12}$, and $R^{13}$ are each independently a hydrogen atom or a methyl groups, $L_1$ is a divalent linking group containing an alkylene group or an oxyalkylene structure, $X_1$ is an oxygen atom or an imino group, and $Z_1$ is a carboxylic acid group.

In addition, the monomer represented by Formula (v) is preferably a compound in which $R^{11}$ is a hydrogen atom or a methyl group, $L_1$ is an alkylene group, and $Z_1$ is a carboxylic acid group, and Y is a methine group.

Further, it is preferable that the monomer represented by Formula (vi) is a compound in which $R^{14}$, $R^{15}$, and $R^{16}$ are each independently a hydrogen atom or a methyl group and $Z_1$ is a carboxylic acid group.

Representative examples of the monomers (the compounds) represented by Formulae (iv) to (vi) are shown below.

Examples of the monomer include methacrylic acid; crotonic acid; isocrotonic acid; a reactant of a compound (for example, 2-hydroxyethyl methacrylate) containing an addition-polymerizable double bond and a hydroxyl group in the molecule, and a succinic anhydride; a reactant of a compound containing an addition-polymerizable double bond and a hydroxyl group anhydride in the molecule, and a phthalic; a reactant of a compound containing an addition-polymerizable double bond and a hydroxyl group in the molecule, and a tetrahydroxyphthalic anhydride; a reactant of a compound containing an addition-polymerizable double bond and a hydroxyl group in the molecule, and a trimellitic anhydride; a reactant of a compound containing an addition-polymerizable double bond and a hydroxyl group in the molecule, and a pyromellitic anhydride; acrylic acid; an acrylic acid dimer; an acrylic acid oligomer; maleic acid; itaconic acid; fumaric acid; 4-vinylbenzoic acid; vinyl phenol; and 4-hydroxyphenylmethacrylate.

The content of the repeating unit containing a functional group capable of forming an interaction with the specific iron-containing particle is preferably 0.05% to 90% by mass, more preferably 1.0% to 80% by mass, and still more preferably 10% to 70% by mass, with respect to the total mass of the resin BX in terms of mass, from the viewpoint of the interaction with the specific iron-containing particle, the temporal stability, and the permeability to a developer.

(Other Repeating Units)

Further, for the intended purpose of improving various performances such as film-forming ability, the resin BX may further have other repeating units (for example, a repeating unit containing a functional group having an affinity with a solvent described later) having various functions, which are different from the repeating unit containing a graft chain, the hydrophobic repeating unit, and the repeating unit containing a functional group capable of forming an interaction with the specific iron-containing particle, as long as the effects of the present invention are not impaired.

Examples of such other repeating units include repeating units derived from radically polymerizable compounds selected from acrylonitriles, methacrylonitriles, or the like. In the resin BX, one or more of these other repeating units can be contained, and the content thereof is preferably 0% to 80% by mass and more preferably 10% to 60% by mass with respect to the total mass of the resin BX in terms of mass.

(Physical Properties of Resin BX)

The acid value of the resin BX is preferably 0 to 250 mgKOH/g, more preferably 10 to 200 mgKOH/g, still more preferably 30 to 180 mgKOH/g, and particularly preferably in a range of 50 to 120 mgKOH/g.

In a case where the acid value of the resin BX is 160 mgKOH/g or less, pattern peeling at the time of developing in the formation of a cured film can be suppressed more effectively. Further, in a case where the acid value of the resin BX is 10 mgKOH/g or more, the alkali developability is better. Further, in a case where the acid value of the resin BX is 20 mgKOH/g or more, the sedimentation of the specific iron-containing particle can be further suppressed, the number of coarse particles can be reduced, and thus the temporal stability of the composition can be further improved.

In the present specification, the acid value can be calculated, for example, from the average content of acid groups in the compound. Further, in a case where the content of the repeating unit containing an acid group in the resin is changed, a resin having a desired acid value can be obtained.

The weight-average molecular weight of the resin BX is preferably 4,000 to 300,000, more preferably 5.000 to 200,000, still more preferably 6,000 to 100,000, and particularly preferably 10,000 to 50,000.

The resin BX can be synthesized based on a known method.

As the specific example of the resin BX, the high-molecular-weight compounds described in paragraphs 0127 to 0129 of JP2013-249417A can be referred to, and the content thereof is incorporated in the present specification.

Further, as the resin BX, the graft copolymers of paragraphs 0037 to 0115 (corresponding paragraphs 0075 to 0133 of US2011/0124824A) of JP2010-106268A can also be used, and the content thereof can be referenced and is incorporated in the present specification.

<Specific Iron-Containing Particle>

The composition X contains an iron-containing particle (the specific iron-containing particle) of which the iron atom content is 10% by mass or more.

The content of the iron atom in the specific iron-containing particle is 10% by mass or more, preferably 30% by mass or more, and more preferably 50% by mass or more, with respect to the total mass of the specific iron-containing particle. The upper limit value of the content of the iron atom in the specific iron-containing particle is not particularly limited; however, it is, for example, 90% by mass or less with respect to the total mass of the specific iron-containing particle. The content of the iron atom in the specific iron-containing particle is determined by the inductively coupled plasma (ICP) analysis.

The specific iron-containing particle is not particularly limited as long as it is a magnetic particle, and examples thereof include an iron particle and an iron alloy particle. As the specific iron-containing particle, it is possible to use, specifically, various alloy particles such as an iron-cobalt alloy, an iron-nickel alloy, an iron-zirconium alloy, an iron-manganese alloy, an iron-silicon alloy, and an iron-aluminum alloy (it is intended that the "alloy particle" referred to here is an alloy particle having a crystal structure in which atoms are periodically arranged, and do not include an amorphous particle described later); an amorphous particle of a Fe—Si—B base, a Fe—Si—B—C base, a Fe—Si—B—Cr base, a Fe—Si—B—Cr—C base, a Fe—Co—Si—B base, a Fe—Si—B—Nb base, or the like; a permalloy particle; a supermalloy particle; a permendur particle; a Sendust particle; or the like.

As the specific iron-containing particle, an iron-cobalt alloy particle or an amorphous particle is particularly preferable.

The average primary particle diameter of the specific iron-containing particle is preferably 0.01 µm or more and more preferably 0.03 µm or more. The average primary particle diameter of the specific iron-containing particle is, for example, 5.0 µm or less, and is preferably 4.0 µm or less, more preferably 0.40 µm or less, still more preferably 0.20 µm or less, and particularly preferably 0.15 µm or less. In a case where the specific iron-containing particle is an iron-cobalt alloy particle, the average primary particle diameter of the specific iron-containing particles is preferably 0.01 to 0.20 µm. In addition, in a case where the specific iron-containing particle is an amorphous particle, the average primary particle diameter of the specific iron-containing particles is preferably 0.10 to 5.0 µm and more preferably 0.50 to 4.0 µm.

The particle diameter of the primary particle of the specific iron-containing particle is measured by taking an image of the specific iron-containing particle using a transmission electron microscope at an imaging magnification of 100,000 times, tracing the contour of a particle (a primary particle) with a digitizer on the printed particle image obtained by printing the specific iron-containing particle on a printing paper so that the total magnification is 500,000 times, and calculating the diameter (the circle area equivalent diameter) of the circle having the same area as the traced region. Here, the primary particle refers to an independent particle without being aggregated. The imaging using a transmission electron microscope shall be carried out by a direct method using a transmission electron microscope at an acceleration voltage of 300 kV. The observation and the measurement with a transmission electron microscope can be carried out using, for example, a transmission electron microscope H-9000 manufactured by Hitachi High-Tech Corporation and an image analysis software KS-400 manufactured by Carl Zeiss AG.

Regarding the shape of the specific iron-containing particle, the "plate shape" means a shape in which two plate surfaces face each other. On the other hand, among the particle shapes that do not have such plate surfaces, the shape in which a major axis and a minor axis are distinguished is the "elliptical shape". The major axis is determined as an axis (the straight line) along which the longest particle length can be taken. On the other hand, the minor axis is determined as an axis along which the particle length is longest in a case where the particle length is taken along a straight line orthogonal to the major axis. A shape in which the major axis and the minor axis are not distinguished, that is, a shape in which the major axis length is equal to the minor axis length is the "spherical shape". A shape in which the major axis and the minor axis cannot be specified from the shape is called an indeterminate shape. The imaging using the transmission electron microscope for specifying the particle shape described above is carried out without subjecting the particles to be imaged to the alignment treatment. The shape of the specific iron-containing particle may be a plate shape, an elliptical shape, a spherical shape, or an indeterminate shape.

Here, as the average primary particle diameter for various particles described in the present specification, a catalog value is adopted in a case where a commercially available product is used.

In a case where a catalog value is not provided, the particle image taken as described above is used to obtain values from 500 particles, which are randomly selected, and an arithmetic mean of the obtained value is used.

The content of the specific iron-containing particle in the composition X is not particularly limited; however, it is preferably 50% by mass or more and more preferably 60% by mass or more, and is preferably 95% by mass or less and more preferably 90% by mass or less, with respect to the total solid content of the composition X.

<Polymerization Initiator>

The composition X contains a polymerization initiator.

The polymerization initiator is not particularly limited, and any known polymerization initiator can be used. Examples of the polymerization initiator include a photopolymerization initiator and a thermal polymerization initiator, and a photopolymerization initiator is preferable. The polymerization initiator is preferably a so-called radical polymerization initiator.

The content of the polymerization initiator in the composition X is not particularly limited; however, it is preferably 0.5% to 15% by mass, more preferably 1.0% to 10% by mass, and still more preferably 1.5% to 8.0% by mass, with respect to the total solid content of the composition X. One kind of the polymerization initiator may be used alone, or two or more kinds thereof may be used in combination. In a case where two or more kinds of polymerization initiators are used in combination, it is preferable that the total content is in the range described above.

(Thermal Polymerization Initiator)

Examples of the thermal polymerization initiator include azo compounds such as 2,2'-azobisisobutyronitrile (AIBN), 3-carboxypropionitrile, azobismalononitrile, and dimethyl-(2,2')-azobis(2-methylpropionate) [V-601] and organic peroxides such as benzoyl peroxide, lauroyl peroxide, and potassium persulfate.

Specific examples of the thermal polymerization initiator include the thermal polymerization initiators described on pages 65 to 148 of "Ultraviolet Curing System" by Kiyomi Kato (published by General Technology Center Co., Ltd.: 1989).

(Photopolymerization Initiator)

The composition X preferably contains a photopolymerization initiator.

The photopolymerization initiator is not particularly limited as long as the polymerization of a polymerizable compound can be initiated, and a known photopolymerization initiator can be used. The photopolymerization initiator is preferable, for example, a photopolymerization initiator having photosensitivity to light in the range from an ultraviolet region to a visible light region. In addition, it may be an activator that causes some action together with a photoexcited sensitizer to generate an active radical or may be an initiator that initiates cationic polymerization depending on the kind of the polymerizable compound.

In addition, the photopolymerization initiator preferably contains at least one compound having a molar absorption coefficient of at least 50 in the range of 300 to 800 nm (more preferably, 330 to 500 nm).

The content of the photopolymerization initiator in the composition X is not particularly limited; however, it is preferably 0.5% to 15% by mass, more preferably 1.0% to 10% by mass, and still more preferably 1.5% to 8.0% by mass, with respect to the total solid content of the composition X. One kind of photopolymerization initiator may be used alone, or two or more kinds thereof may be used in combination. In a case where two or more kinds of photopolymerization initiators are used in combination, it is preferable that the total content is in the range described above.

Examples of the photopolymerization initiator include a halogenated hydrocarbon derivative (for example, a compound containing a triazine skeleton or a compound containing an oxadiazole skeleton), an acylphosphine compound such as an acylphosphine oxide, hexaarylbiimidazole, an oxime compound such as an oxime derivative, an organic peroxide, a thio compound, a ketone compound, an aromatic onium salt, an aminoacetophenone compound, and hydroxyacetophenone.

As a specific example of the photopolymerization initiator, for example, paragraphs 0265 to 0268 of JP2013-29760A can be referred to, and the content thereof is incorporated in the present specification.

More specifically, as the photopolymerization initiator, for example, the aminoacetophenone-based initiator described in JP1998-291969A (JP-H10-291969A) and the acylphosphine-based initiator described in JP4225898B can also be used.

As the hydroxyacetophenone compound, for example, IRGACURE-184, DAROCUR-1173, IRGACURE-500, IRGACURE-2959, and IRGACURE-127 (all trade names, all manufactured by BASF SE) can be used.

As the aminoacetophenone compound, for example, IRGACURE-907, IRGACURE-369, and IRGACURE-379EG (all trade names, all manufactured by BASF SE) which are commercially available products can be used. As the aminoacetophenone compound, the compound described in JP2009-191179A, an absorption wavelength of which is matched to a light source of a long wavelength such as a wavelength of 365 nm or a wavelength of 405 nm, can also be used.

As the acylphosphine compound, a commercially available IRGACURE-819 and IRGACURE-TPO (both trade names, both manufactured by BASF SE) can be used.

Oxime Compound

The photopolymerization initiator is preferably an oxime ester-based polymerization initiator (an oxime compound). In particular, the oxime compound is preferable since it has high sensitivity and high polymerization efficiency, and the content of the coloring material in the composition X is easily set to be high.

As the specific example of the oxime compound, the compound described in JP2001-233842A, the compound described in JP2000-80068A, or the compound described in JP2006-342166A can be used.

Examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

In addition, examples thereof include J. C. S. Perkin 11 (1979) pp. 1653 to 1660, J. C. S. Perkin 11 (1979) pp. 156 to 162. Journal of Photopolymer Science and Technology (1995) pp. 202 to 232, the compound described in JP2000-66385A, and the compounds described in JP2000-80068A, JP2004-534797A, and JP2006-342166A.

As the commercially available product, IRGACURE-OXE01 (manufactured by BASF SE), IRGACURE-OXE02 (manufactured by BASF SE), IRGACURE-OXE03 (manufactured by BASF SE), or IRGACURE-OXE04 (manufactured by BASF SE) is also preferable. In addition, TR-PBG-304 (manufactured by Changzhou Qiangli Xianduan Electronic Materials Co., Ltd.), ADEKA ARKLS NCI-831, ADEKA ARKLS NCI-930 (manufactured by ADEKA Corporation), or N-1919 (a photoinitiator containing a carbazole-oxime ester skeleton) (manufactured by ADEKA Corporation) can also be used.

Further, as an oxime compound other than those described above, the following compound may be used: the compound described in JP2009-519904A, in which an oxime is linked to the N position of carbazole; the compound described in U.S. Pat. No. 7,626,957B, in which a hetero substituent is introduced at a benzophenone moiety; the compounds described in JP2010-15025A and US2009/292039A, in which a nitro group is introduced into a dye moiety; the ketooxime compound described in WO2009/131189A; the compound described in U.S. Pat. No. 7,556,910A, which contains a triazine skeleton and an oxime structure in the same molecule; the compound described in JP2009-221114A, which has the maximum absorption at 405 nm and has good sensitivity to a g-ray light source; or the like.

For example, paragraphs 0274 and 0275 of JP2013-29760A can be referenced, the content of which is incorporated in the present specification.

Specifically, the oxime compound is preferably a compound represented by Formula (OX-1). It is noted that the N—O bond of the oxime compound may be an (E) form oxime compound, a (Z) form oxime compound, or a mixture of an (E) form and a (Z) form.

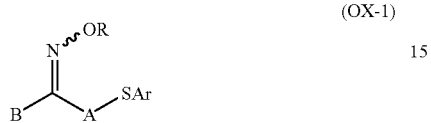

(OX-1)

In Formula (OX-1), R and B each independently represent a monovalent substituent, A represents a divalent organic group, and Ar represents an aryl group.

In Formula (OX-1), the monovalent substituent represented by R is preferably a monovalent non-metal atomic group.

Examples of the monovalent non-metal atomic group include an alkyl group. an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may be further substituted with another substituent.

Examples of the substituent include a halogen atom, an aryloxy group, an alkoxycarbonyl group or an arvloxycarbonyl group, an acyloxy group, an acyl group, an alkyl group, and an aryl group.

In Formula (OX-1), the monovalent substituent represented by B is preferably an aryl group, a heterocyclic group, an arylcarbonyl group, or a heterocyclic carbonyl group, and more preferably an aryl group or a heterocyclic group. These groups may have one or more substituents. Examples of the substituent include the above-described substituents. In Formula (OX-1), the divalent organic group represented by A is preferably an alkylene group, a cycloalkylene group, or an alkynylene group, which has 1 to 12 carbon atoms. These groups may have one or more substituents. Examples of the substituent include the above-described substituents.

As the photopolymerization initiator, an oxime compound containing a fluorine atom can also be used. Specific examples of the oxime compound containing a fluorine atom include the compounds described in JP2010-262028A; the compounds 24, 36 to 40, described in JP2014-500852A; and the compound (C-3) described in JP2013-164471A. The contents thereof are incorporated in the present specification.

As the photopolymerization initiator, compounds represented by Formulae (1) to (4) can also be used.

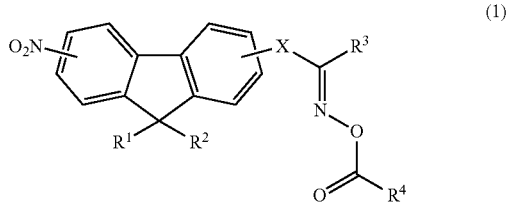

(1)

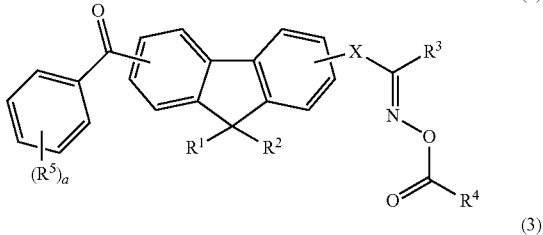

(2)

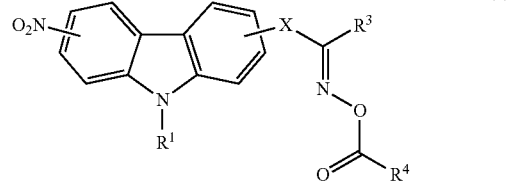

(3)

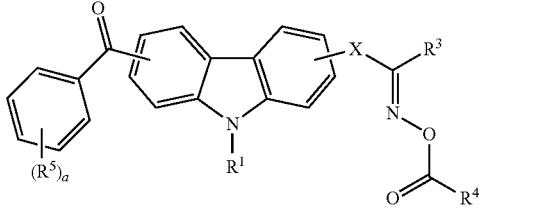

(4)

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms, and in a case where $R^1$ and $R^2$ are a phenyl group, the phenyl groups may be bonded to each other to form a fluorene group, $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and X represents a direct bond or a carbonyl group.

In Formula (2), $R^1$, $R^2$, $R^3$, and $R^4$ are respectively synonymous with $R^1$, $R^2$, $R^3$, and $R^4$ in Formula (1); $R^5$ represents —$R^6$, —OR6, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, where $R^6$ represents an alkyl group having 1 to 20 carbon atoms, an aryl group having 6 to 30 carbon atoms, an arylalkyl group having 7 to 30 carbon atoms, or a heterocyclic group having 4 to 20 carbon atoms; X represents a direct bond or a carbonyl group; and a represents an integer of 0 to 4.

In Formula (3), $R^1$ represents an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms; $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms; and X represents a direct bond or a carbonyl group.

In Formula (4), $R^1$, $R^3$, and $R^4$ are respectively synonymous with $R^1$, $R^3$, and $R^4$ in Formula (3); $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, where $R^6$ represents an alkyl group having 1 to 20 carbon atoms, an aryl group having 6 to 30 carbon atoms, an arylalkyl group having 7 to 30 carbon atoms, or a heterocyclic group having 4 to 20 carbon atoms; X represents a direct bond or a carbonyl group; and a represents an integer of 0 to 4.

In Formulae (1) and (2), $R^1$ and $R^2$ are preferably a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bind.

In addition, in Formulae (3) and (4), $R^1$ is preferably a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bind.

Specific examples of the compounds represented by Formula (1) and Formula (2) include the compounds described in paragraphs 0076 to 0079 of JP2014-137466A. The contents thereof are incorporated in the present specification.

Specific examples of the oxime compound that is preferably used in the composition X are shown below. Among the oxime compounds shown below, an oxime compound represented by General Formula (C-13) is more preferable.

Further, as the oxime compound, the compounds shown in Table 1 of WO2015/036910A can also be used, and the above content is incorporated in the present specification.

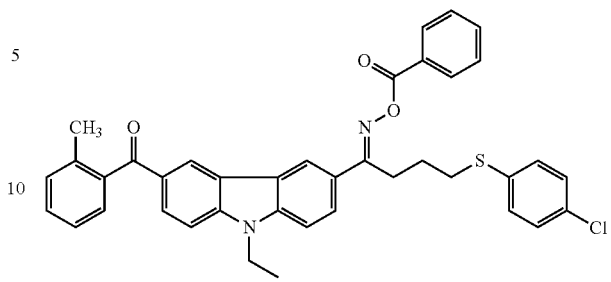
(C-4)

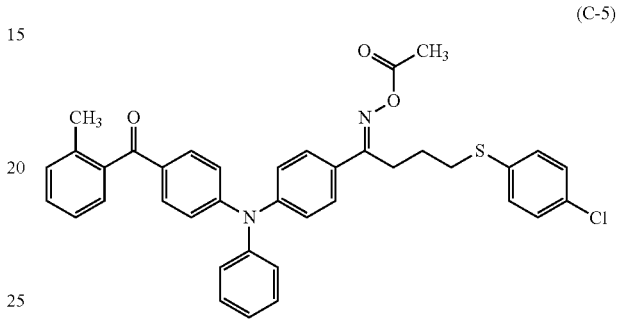
(C-5)

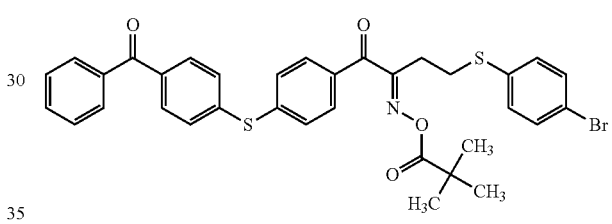
(C-6)

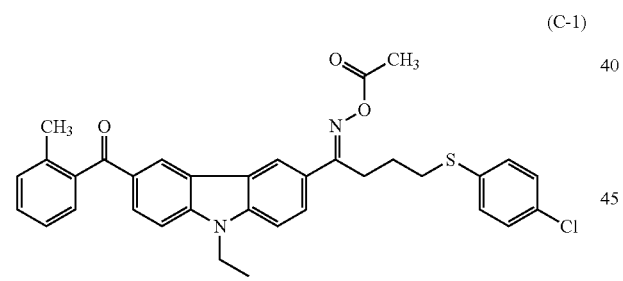
(C-1)

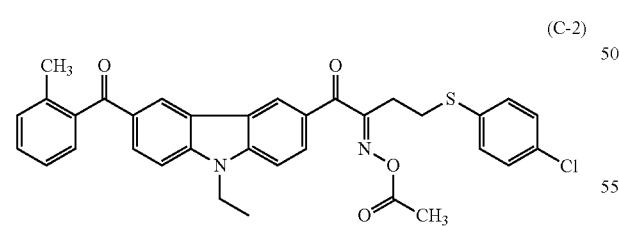
(C-2)

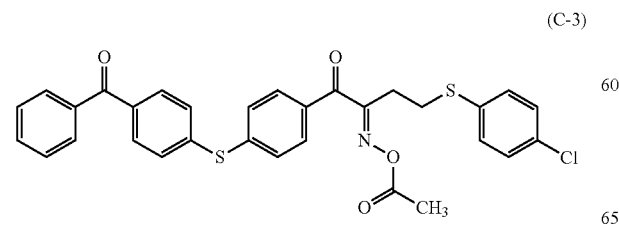
(C-3)

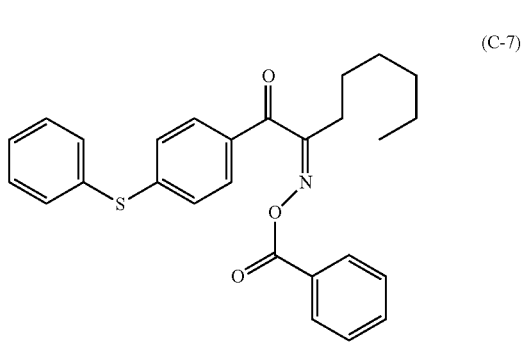
(C-7)

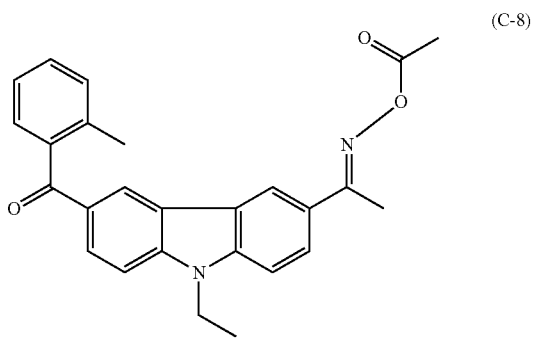
(C-8)

(C-9)

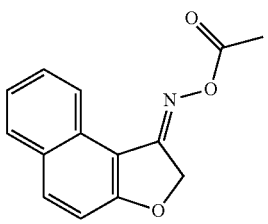

(C-13)

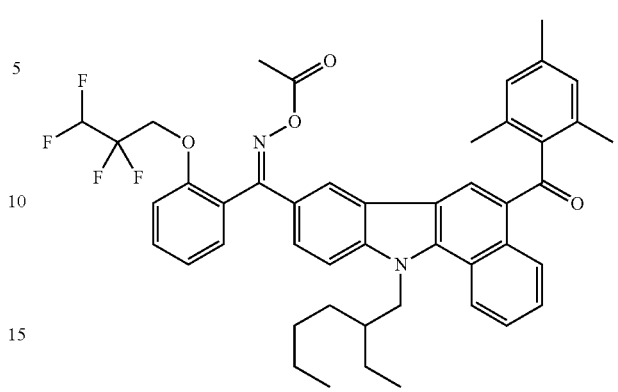

(C-10)

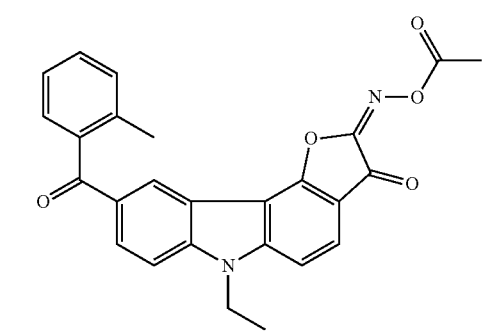

(C-11)

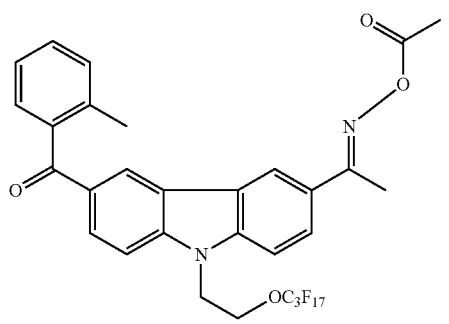

(C-12)

The oxime compound preferably has a maximal absorption in a wavelength range of 350 to 500 nm, more preferably has a maximal absorption in a wavelength range of 360 to 480 nm, and still more preferably has high absorbance at wavelengths of 365 nm and 405 nm.

The molar absorption coefficient of the oxime compound at 365 nm or 405 nm is preferably 1,000 to 300,000, more preferably 2,000 to 300,000, and still more preferably 5,000 to 200,000, from the viewpoint of sensitivity.

The molar absorption coefficient of a compound can be measured by a known method; however, for example, it is preferably measured with an ultraviolet-visible spectrophotometer (a Cary-5 spectrophotometer, manufactured by Varian Medical Systems, Inc.) using ethyl acetate at a concentration of 0.01 g/L.

Two or more kinds of photopolymerization initiators may be used in combination as necessary.

In addition, as the photopolymerization initiator, the compounds described in paragraphs 0052 of JP2008-260927A, paragraphs 0033 to 0037 of JP2010-97210A, and paragraphs 0044 of JP2015-68893A can also be used, and the above contents are incorporated in the present specification.

<Alkali-Soluble Resin>

The composition X preferably contains an alkali-soluble resin. In the present specification, the alkali-soluble resin means a resin containing a group (an alkali-soluble group, for example, an acid group such as a carboxylic acid group) that promotes alkali solubility and means a resin that is different from the resin BX (and the resin BY described later) already described above.

The resin referred to here means a component that is dissolved in the composition X and has a weight-average molecular weight of more than 2,000.

The content of the alkali-soluble resin in the composition X is not particularly limited; however, it is preferably 0.1% to 40% by mass, more preferably 0.5% to 30% by mass, and still more preferably 1.0% to 25% by mass, with respect to the total solid content of the composition X.

One kind of alkali-soluble resin may be used alone, or two or more kinds thereof may be used in combination. In a case where two or more kinds of alkali-soluble resins are used in combination, the total content thereof is preferably within the above range.

Examples of the alkali-soluble resin include resins containing at least one alkali-soluble group in the molecule, and examples thereof include a polyhydroxystyrene resin, a polysiloxane resin, a (meth)acrylic resin, a (meth)acrylamide resin, a (meth)acrylic/(meth)acrylamide copolymer resin, an epoxy resin, and a polyimide resin.

Specific examples of the alkali-soluble resin include a copolymer of an unsaturated carboxylic acid and an ethylenically unsaturated compound.

The unsaturated carboxylic acid is not particularly limited; however, examples thereof include monocarboxylic acids such as (meth)acrylic acid, crotonic acid, and vinylacetic acid; dicarboxylic acids such as itaconic acid, maleic acid, and fumaric acid, or an acid anhydride thereof; and polyvalent carboxylic acid monoesters such as mono(2-(meth)acryloyloxyethyl)phthalates.

Examples of the ethylenically unsaturated compound that is copolymerizable include methyl (meth)acrylate. In addition, the compounds described in paragraphs 0027 of JP2010-97210A and paragraphs 0036 and 0037 of JP2015-68893A can also be used, and the above contents are incorporated in the present specification.

The alkali-soluble resin is also preferably an alkali-soluble resin containing a curable group.

Examples of the curable group include, but are not limited thereto, ethylenic unsaturated groups (for example, a (meth) acryloyl group, a vinyl group, and a styryl group) and cyclic ether groups (for example, an epoxy group and an oxetanyl group).

Among them, the curable group is preferably an ethylenic unsaturated group and more preferably a (meth)acryloyl group from the viewpoint that the polymerization can be controlled with the radical reaction.

The alkali-soluble resin containing a curable group is preferably an alkali-soluble resin or the like, which has a curable group in the side chain. Examples of the alkali-soluble resin containing a curable group include DIANAL NR series (manufactured by Mitsubishi Chemical Corporation), Photomer 6173 (a COOH-containing polyurethane acrylic oligomer, manufactured by Diamond Shamrock Co., Ltd.), Viscoat R-264 and KS resist 106 (both manufactured by Osaka Organic Chemical Industry Ltd.), Cyclomer P series (for example, ACA230AA) and PLACCEL CF200 series (both manufactured by Daicel Corporation), Ebecryl 3800 (manufactured by DAICEL-ALLNEX Ltd.), and ACRYCURE RD-F8 (manufactured by Nippon Shokubai Co., Ltd.).

In addition, the alkali-soluble resin containing a repeating unit containing an ethylenic unsaturated group in the side chain is also obtained, for example, by subjecting an ethylenically unsaturated compound containing a glycidyl group or an alicyclic epoxy group to an addition reaction with a carboxylic acid group in a resin containing the carboxylic acid group, such as a resin containing a repeating unit derived from (meth)acrylic acid.

As the alkali-soluble resin, the followings and the like can be used: the radical polymers containing a carboxylic acid group in the side chain, which are described in JP1984-44615A (JP-S59-44615), JP1979-34327B (JP-S54-34327B), JP1983-12577B (JP-S58-12577B), JP1979-25957B (JP-S54-25957B), JP1979-92723A (JP-S54-92723A), JP1984-53836A (JP-S59-53836A), and JP1984-71048A (JP-S59-71048A); the acetal-modified polyvinyl alcohol-based binder resins containing an alkali-soluble group, which are described in EP993966B, EP1204000B, and JP2001-318436A; polyvinylpyrrolidone; polyethylene oxide; an alcohol-soluble nylon, a polyether which is a reactant of 2,2-bis-(4-hydroxyphenyl)-propane and epichlorohydrin, and the like; and the polyimide resin described in WO2008/123097A.

As the alkali-soluble resin, for example, the compounds described in paragraphs 0225 to 0245 of JP2016-75845A can also be used, and the above content is incorporated in the present specification.

As the alkali-soluble resin, a polyimide precursor can also be used. The polyimide precursor means a resin obtained by an addition polymerization reaction of a compound containing an acid anhydride group and a diamine compound at 40° C. to 100° C. Specific examples of the polyimide precursor include the compounds described in paragraphs 0011 to 0031 of JP2008-106250A, the compounds described in paragraphs 0022 to 0039 of JP2016-122101A, the compounds described in paragraphs 0061 to 0092 of JP2016-68401A, the resins described in paragraph 0050 of JP2014-137523A, the resins described in paragraph 0058 of JP2015-187676A, and the resins described in paragraphs 0012 and 0013 of JP2014-106326A, and the above contents are incorporated in the present specification.

As the alkali-soluble resin, a [benzyl(meth)acrylate/(meth)acrylic acid/another addition-polymerizable vinyl monomer as necessary]copolymer and a [allyl(meth)acrylate/(meth)acrylic acid/another addition-polymerizable vinyl monomer as necessary] copolymer are suitable since they have an excellent balance of film hardness, sensitivity, and developability.

The other addition-polymerizable vinyl monomer may be used alone or in a combination of two or more thereof.

The above copolymer preferably has a curable group and more preferably contains an ethylenic unsaturated group such as a (meth)acryloyl group from the viewpoint that the moisture resistance of a cured film is more excellent.

For example, as the other addition-polymerizable vinyl monomer, a monomer having a curable group may be used to introduce a curable group into a copolymer. In addition, a curable group (preferably, an ethylenic unsaturated group such as (meth)acryloyl group) may be introduced into a part of or all of one or more units derived from (meth)acrylic acid and/or units derived from the other addition-polymerizable vinyl monomer in the copolymer.

Examples of the other addition-polymerizable vinyl monomer include methyl (meth)acrylate, a styrene-based monomer (hydroxystyrene, and the like), and an ether dimer.

Examples of the ether dimer include a compound represented by General Formula (ED1) and a compound represented by General Formula (ED2).

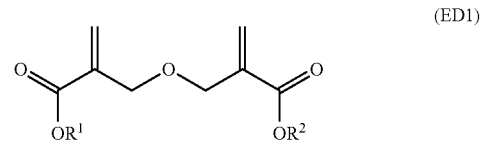

(ED1)

In General Formula (ED1), $R^1$ and $R^2$ each independently represent a hydrogen atom or a hydrocarbon group having 1 to 25 carbon atoms.

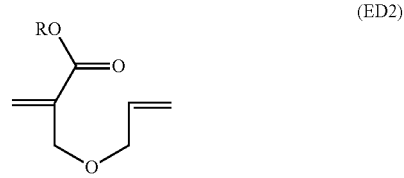

(ED2)

In General Formula (ED2), R represents a hydrogen atom or an organic group having 1 to 30 carbon atoms. As the specific example of General Formula (ED2), the description of JP2010-168539A can be referenced.

As the specific example of the ether dimer, for example, paragraph 0317 of JP2013-29760A can be referenced, and the content thereof is incorporated in the present specification. The ether dimer may be only one kind or two or more kinds.

The acid value of the alkali-soluble resin is not particularly limited; however, generally, it is preferably 30 to 500 mgKOH/g and more preferably 50 to 200 mgKOH/g.

<Polymerizable Compound>

The composition X of the present invention preferably contains a polymerizable compound.

In the present specification, the polymerizable compound means a compound that polymerizes under the action of the above-described polymerization initiator and means a component different from the above-described resin BX and alkali-soluble resin. That is, the polymerizable compound does not have a graft chain.

The content of the polymerizable compound in the composition X is not particularly limited; however, it is preferably 1% to 25% by mass, more preferably 1% to 20% by mass, and still more preferably 3% to 15% by mass, with respect to the total solid content of the composition X. One kind of the polymerizable compound may be used alone, or two or more kinds thereof may be used in combination. In a case where two or more kinds of polymerizable compounds are used in combination, it is preferable that the total content is in the range described above.

The molecular weight (or the weight-average molecular weight) of the polymerizable compound is not particularly limited; however, it is preferably 2,000 or less.

The polymerizable compound is preferably a compound containing a group (hereinafter, also simply referred to as an "ethylenic unsaturated group") that contains an ethylenic unsaturated bond.

That is, the composition X of the present invention preferably contains a low-molecular-weight compound containing an ethylenic unsaturated group as the polymerizable compound.

The polymerizable compound is preferably a compound containing one or more ethylenic unsaturated bonds, more preferably a compound containing two or more ethylenic unsaturated groups, still more preferably a compound containing three or more ethylenic unsaturated groups, and particularly preferably a compound containing five or more ethylenic unsaturated groups. The upper limit is, for example, 15 ethylenic unsaturated groups or less. Examples of the ethylenic unsaturated group include a vinyl group, a (meth)allyl group, and a (meth)acryloyl group.

As the polymerizable compound, for example, the compounds described in paragraph 0050 of JP2008-260927A and paragraph 0040 of JP2015-68893A can be used, and the above contents are incorporated in the present specification.

The polymerizable compound may have any chemical form such as a monomer, a prepolymer, an oligomer, or a mixture thereof, or a multimer thereof.

The polymerizable compound is preferably a tri- to pentadeca-functional (meth)acrylate compound and more preferably a tri- to hexa-functional (meth)acrylate compound.

The polymerizable compound is also preferably a compound containing one or more ethylenic unsaturated groups and having a boiling point of 100° C. or higher under normal pressure. For example, the compounds described in paragraphs 0227 of JP2013-29760A and paragraphs 0254 to 0257 of JP2008-292970A can be referred to, and the contents thereof are incorporated in the present specification.

The polymerizable compound is preferably the following compound: dipentaerythritol triacrylate (as a commercially available product, KAYARAD D-330; manufactured by Nippon Kayaku Co., Ltd.), dipentaerythritol tetraacrylate (as a commercially available product, KAYARAD D-320; manufactured by Nippon Kayaku Co., Ltd.), dipentaerythritol penta(meth)acrylate (as a commercially available product, KAYARAD D-310; manufactured by Nippon Kayaku Co., Ltd.), dipentaerythritol hexa(meth)acrylate (as commercially available products. KAYARAD DPHA; manufactured by Nippon Kayaku Co. Ltd., A-DPH-12E: manufactured by SHIN-NAKAMURA CHEMICAL Co, Ltd.), or a structure (for example, SR454 or SR499, which is commercially available from Sartomer Company Inc.) in which a (meth)acryloyl group of the above compound is bonded through an ethylene glycol residue or a propylene glycol residue. Oligomer types thereof can also be used. In addition, NK ester A-TMMT (pentaerythritol tetraacrylate, manufactured by SHIN-NAKAMURA CHEMICAL Co, Ltd.), KAYARAD RP-1040, KAYARAD DPEA-12LT, KAYARAD DPHA LT, KAYARAD RP-3060, KAYARAD DPEA-12 (all trade names, manufactured by Nippon Kayaku Co., Ltd.), or the like may be used.

A preferred aspect of the polymerizable compound is described below.

The polymerizable compound may have an acid group such as a carboxylic acid group, a sulfonic acid group, or a phosphoric acid group. The polymerizable compound containing an acid group is preferably an ester of an aliphatic polyhydroxy compound and an unsaturated carboxylic acid, more preferably a polymerizable compound having an acid group that is obtained by reacting a non-aromatic carboxylic acid anhydride with an unreacted hydroxyl group of an aliphatic polyhydroxy compound, and in this ester, still more preferably a compound which the aliphatic polyhydroxy compound is pentaerythritol and/or dipentaerythritol. Examples of the commercially available product thereof include ARONIX TO-2349, M-305, M-510, and M-520, manufactured by Toagosei Co., Ltd.

The acid value of the polymerizable compound containing an acid group is preferably 0.1 to 40 mgKOH/g and more preferably 5 to 30 mgKOH/g. In a case where the acid value of the polymerizable compound is 0.1 mgKOH/g or more, the developing and dissolving properties are good, and in a case where it is 40 mgKOH/g or less, it is advantageous in production and/or handling. Furthermore, the photopolymerization performance is good and the curability is excellent.

An aspect in which the polymerizable compound includes a compound containing a caprolactone structure is also the preferred aspect.

The compound containing a caprolactone structure is not particularly limited as long as the caprolactone structure is contained in the molecule; however, examples thereof include an ε-caprolactone-modified polyfunctional (meth) acrylate obtained by esterifying a polyhydric alcohol such as trimethylolethane, ditrimethylolethane, trimethylolpropane, ditrimethylolpropane, pentaerythritol, dipentaerythritol, tripentaerythritol, glycerin, diglycerol, or trimethylolmelamine with (meth)acrylic acid and ε-caprolactone. Among them, a compound containing a caprolactone structure, represented by Formula (Z-1), is preferable.

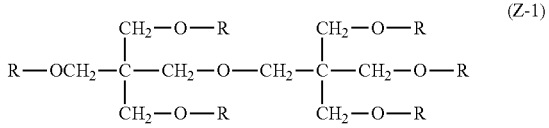

(Z-1)

In Formula (Z-1), all 6 pieces R's are a group represented by Formula (Z-2), or 1 to 5 pieces of the 6 pieces of R's are a group represented by Formula (Z-2), and the rest thereof are a group represented by Formula (Z-3).

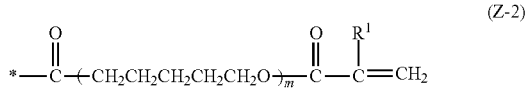

(Z-2)

In Formula (Z-2), $R^1$ represents a hydrogen atom or a methyl group, m represents a number of 1 or 2, and "*" represents a bonding site.

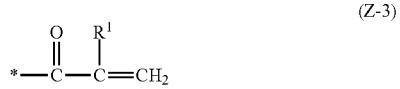

(Z-3)

In Formula (Z-3), $R^1$ represents a hydrogen atom or a methyl group, and "*" represents a bonding site.

The polymerizable compound containing a caprolactone structure is commercially available, for example, from Nippon Kayaku Co., Ltd. as the KAYARAD DPCA series, which include DPCA-20 (a compound that satisfies, in Formulae (Z-1) to (Z-3): m=1; the number of groups represented by Formula (Z-2)=2; all R's are a hydrogen atom), DPCA-30 (a compound that satisfies, in the same formulae above: m=1; the number of groups represented by Formula (Z-2)=3; all $R^1$'s are a hydrogen atom), DPCA-60 (a compound that satisfies, in the same formulae above: m=1; the number of groups represented by Formula (Z-2)=6; all $R^1$'s are a hydrogen atom), and DPCA-120 (a compound that satisfies, in the same formulae above: m=2; the number of groups represented by Formula (Z-2)=6; all R's are a hydrogen atom). In addition, the commercially available product of the polymerizable compound containing a caprolactone structure includes M-350 (trade name) (trimethylolpropane triacrylate) manufactured by Toagosei Co., Ltd.

As the polymerizable compound, a compound represented by Formula (Z-4) or (Z-5) can also be used.

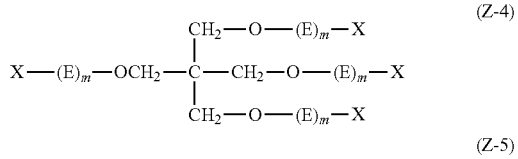

(Z-4)

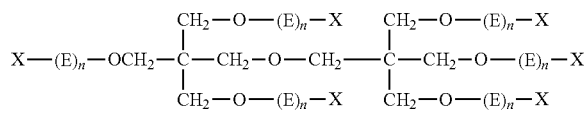

(Z-5)

In Formulae (Z-4) and (Z-5). E represents $-((CH_2)_y CH_2O)-$ or $-((CH_2)_y CH(CH_3)O)-$, y represents an integer of 0 to 10, and X represents a (meth)acryloyl group, a hydrogen atom, or a carboxylic acid group.

In Formula (Z-4), the total of (meth)acryloyl groups is 3 or 4, m represents an integer of 0 to 10, and the total of individual m's is an integer of 0 to 40.

In Formula (Z-5), the total of (meth)acryloyl groups is 5 or 6, n represents an integer of 0 to 10, and the total of individual n's is an integer of 0 to 60.

In Formula (Z-4), m is preferably an integer of 0 to 6 and more preferably an integer of 0 to 4.

In addition, the total of individual m's is preferably an integer of 2 to 40, more preferably an integer of 2 to 16, and still more preferably an integer of 4 to 8.

In Formula (Z-5), n is preferably an integer of 0 to 6 and more preferably an integer of 0 to 4.

In addition, the total of individual n's is preferably an integer of 3 to 60, more preferably an integer of 3 to 24, and still more preferably an integer of 6 to 12. In addition, the preferred aspect is an aspect in which the terminal on the side of the oxygen atom in $-((CH_2)_y CH_2O)-$ or $-((CH_2)_y CH(CH_3)O)-$ in Formula (Z-4) or Formula (Z-5) is bonded to X.

One kind of the compound represented by Formula (Z-4) or Formula (Z-5) may be used alone, or two or more kinds thereof may be used in combination. In particular, an aspect in which all 6 pieces of X's are an acryloyl group in Formula (Z-5) or an aspect in which a mixture of a compound in which all 6 pieces of X's are an acryloyl group and a compound in which at least one of all 6 pieces of X's is a hydrogen atom, in Formula (Z-5), is provided is preferable. Such a configuration makes it possible to further increase developability.

In addition, the total content of the compound represented by Formula (Z-4) or Formula (Z-5) in the polymerizable compound is preferably 20% by mass or more and more preferably 50% by mass or more.

Among the compounds represented by Formula (Z-4) or Formula (Z-5), the pentaerythritol derivative and/or the dipentaerythritol derivative is more preferable.

In addition, the polymerizable compound may contain a cardo skeleton.

The polymerizable compound containing a cardo skeleton is preferably a polymerizable compound containing a 9,9-bisarylfluorene skeleton.

The polymerizable compound containing a cardo skeleton is not limited, however, examples thereof include Oncoat EX series (manufactured by NAGASE & Co., Ltd.) and OGSOL (manufactured by Osaka Gas Chemicals Co. Ltd.).

The polymerizable compound is also preferably a compound containing an isocyanuric acid skeleton as the central core. Examples of such a polymerizable compound include NK Ester A-9300 (manufactured by SHIN-NAKAMURA CHEMICAL Co, Ltd.).

The content (which means a value obtained by dividing the number of ethylenic unsaturated groups in the polymerizable compound by the molecular weight (g/mol) of the polymerizable compound) of the ethylenic unsaturated group in the polymerizable compound is preferably 5.0 mmol/g or more. The upper limit thereof is not particularly limited; however, it is generally 20.0 mmol/g or less.

<Polymerization Inhibitor>

The composition X may contain a polymerization inhibitor.

The polymerization inhibitor is not particularly limited, and a known polymerization inhibitor can be used. Examples of the polymerization inhibitor include phenol-based polymerization inhibitors (for example, p-methoxyphenol, 2,5-di-tert-butyl-4-methylphenol, 2,6-di-tert-butyl-4-methylphenol, 4,4'-thiobis(3-methyl-6-t-butylphenol), 2,2'-methylenebis(4-methyl-6-t-butylphenol), and 4-methoxynaphthol); hydroquinone-based polymerization inhibitors (for example, hydroquinone and 2,6-di-tert-butylhyrodroquinone); quinone-based polymerization inhibitors (for example, benzoquinone); free radical-based polymerization inhibitors (for example, a 2,2,6,6-tetramethylpiperidin-1-oxyl free radical and a 4-hydroxy-2,2,6,6-tetramethylpiperidin-1-oxyl free radical); nitrobenzene-based polymerization inhibitors (for example, nitrobenzene and 4-nitrotoluene); and phenothiazine-based polymerization inhibitors (for example, phenothiazine and 2-methoxyphenothiazine).

Among them, a phenol-based polymerization inhibitor or a free radical-based polymerization inhibitor is preferable from the viewpoint that the composition X has a more excellent effect.

The polymerization inhibitor has a remarkable effect in a case of being used together with a resin containing a curable group.

The content of the polymerization inhibitor in the composition X is not particularly limited; however, it is preferably 0.0001% to 0.5% by mass, more preferably 0.0001% to 0.2% by mass, and still more preferably 0.0001% to 0.05% by mass, with respect to the total solid content of the composition X. One kind of the polymerization inhibitor may be used alone, or two or more kinds thereof may be used in combination. In a case where two or more kinds of polymerization inhibitors are used in combination, it is preferable that the total content is in the range described above.

In addition, the ratio of the content of the polymerization inhibitor to the content of the polymerizable compound in the composition X (the content of the polymerization inhibitor/the content of the polymerizable compound (mass ratio)) is preferably more than 0.0005, more preferably 0.0006 to 0.02, and still more preferably 0.0006 to 0.005.

<Surfactant>

The composition X may contain a surfactant. The surfactant contributes to the improvement of the coatability of the composition X.

In a case where the composition X contains a surfactant, the content of the surfactant is preferably 0.001% to 2.0% by mass, more preferably 0.005% to 0.5% by mass, and still more preferably 0.01% to 0.1% by mass, with respect to the total solid content of the composition X.

One kind of the surfactant may be used alone, or two or more kinds thereof may be used in combination. In a case where two or more kinds of surfactants are used in combination, the total amount thereof is preferably within the above range.

Examples of the surfactant include a fluorine-based surfactant, a nonionic surfactant, a cationic surfactant, an anionic surfactant, and a silicone-based surfactant.

For example, in a case where the composition X contains a fluorine-based surfactant, the liquid properties (particularly, the fluidity) of the composition X are further improved. That is, in a case where a film is formed using the composition X containing a fluorine-based surfactant, the interfacial tension between a surface to be coated and a coating liquid is reduced, and the wettability to the surface to be coated is improved, and thus the coatability to the surface to be coated is improved. As a result, even in a case where a thin film of about several micrometers is formed with a small liquid amount, it is effective in that a film having a uniform thickness with small thickness unevenness can be suitably formed.

The fluorine content in the fluorine-based surfactant is preferably 3% to 40% by mass, more preferably 5% to 30% by mass, and still more preferably 7% to 25% by mass. The fluorine-based surfactant having a fluorine content within this range is effective in terms of the uniformity of coating film thickness and/or the liquid saving and also has good solubility in the composition X.

Examples of the fluorine-based surfactant include MEGAFACE F171, MEGAFACE F172, MEGAFACE F173, MEGAFACE F176, MEGAFACE F177, MEGAFACE F141, MEGAFACE F142. MEGAFACE F143, MEGAFACE F144. MEGAFACE R30, MEGAFACE F437, MEGAFACE F475, MEGAFACE F479, MEGAFACE F482, MEGAFACE F554, and MEGAFACE F780 (all manufactured by DIC Corporation); Florard FC430, Florard FC431, and Florard FC171 (all manufactured by Sumitomo 3M Limited); Surflon S-382, Surflon SC-101, Surflon SC-103, Surflon SC-104, Surflon SC-105, Surflon SC1068, Surflon SC-381, Surflon SC-383. Surflon 5393, and Surflon KH-40 (all manufactured by AGC Inc.); and PF636, PF656, PF6320, PF6520, and PF7002 (manufactured by OMNOVA Solutions Inc.). A block polymer can also be used as the fluorine-based surfactant, and specific examples thereof include the compound described in JP2011-89090A.

<Solvent>

The composition X preferably contains a solvent.

The solvent is not particularly limited, and a known solvent can be used.

The content of the solvent in the composition X is not particularly limited; however, the content of the solvent is such that the solid content of the composition X is preferably 10% to 90% by mass, more preferably 10% to 80% by mass, and still more preferably 15% to 75% by mass.

One kind of solvent may be used alone, or two or more kinds thereof may be used in combination. In a case where two or more kinds of solvents are used in combination, it is preferable that the total solid content of the composition X is adjusted to be within the above range.

Examples of the solvent include organic solvents.

(Organic Solvent)

Examples of the organic solvent include, but not limited thereto, acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate. 3-methoxypropyl acetate, N,N-dimethylformamide, dimethyl sulfoxide, γ-butyrolactone, ethyl acetate, butyl acetate, methyl lactate, N-methyl-2-pyrrolidone, and ethyl lactate.

<Other Optional Components>

The composition X may further contain other optional components other than the above-described components. Examples thereof include a sensitizing agent, a co-sensitizing agent, a cross-linking agent, a curing accelerator, a thermosetting accelerator, a plasticizer, a diluent, and an oil sensitizing agent. Known additives such as an attachment promoting agent to a substrate surface and other auxiliary agents (for example, an antifoaming agent, a flame retardant, a leveling agent, a peeling accelerator, an antioxidant, a fragrance, a surface tension adjuster, and a chain transfer agent) may be further added as necessary.

Next, various components that the composition Y of the present invention contains essentially or optionally will be described.

[Composition Y]

The composition Y contains a compound having an ethylenic unsaturated group, the resin BY, the specific iron-containing particle, and a polymerization initiator.

The composition Y has the same aspect (components and formulations) as the above-described composition X except that it contains a resin BY instead of the above-described resin BX and contains a compound having an ethylenic unsaturated group, and the same applies to the preferred aspect thereof.

Hereinafter, the compound having an ethylenic unsaturated group and the resin BY, which are essentially contained in the composition Y, will be described.

<Compound Having Ethylenic Unsaturated Group>

The composition Y contains a compound having an ethylenic unsaturated group. In a case where the composition Y contains a compound having an ethylenic unsaturated group, the composition Y exhibits more excellent pattern formation properties.

The ethylenic unsaturated group is not particularly limited; however, examples thereof include a (meth)acryloyl group, a vinyl group. and a styryl group, and a (meth) acryloyl group is preferable.

The aspect of the compound having an ethylenic unsaturated group may be any one of a monomer, an oligomer, or a polymer.

The content of the compound having an ethylenic unsaturated group in the composition Y is not particularly limited; however, it is, for example, preferably 0.1% to 30% by mass with respect to the total solid content of the composition Y.

One kind of compound having an ethylenic unsaturated group may be used alone, or two or more kinds thereof may be used in combination. In a case where a compound having two or more kinds of ethylenic unsaturated groups is used in combination, the total content thereof is preferably within the above range.

Specific examples of the compound having an ethylenic unsaturated group include an alkali-soluble resin containing an ethylenic unsaturated group in the side chain, which is exemplified in the above-described <Alkali-soluble resin> as a component that can be contained in the composition X, and a low-molecular-weight compound containing an ethylenic unsaturated group among the above-described <Polymerizable compounds> as a component that can be contained in the composition X.

In a case where the composition Y contains an alkali-soluble resin containing an ethylenic unsaturated group in the side chain, the content thereof is not particularly limited; however, it is preferably 0.1% to 20% by mass, more preferably 0.5% to 15% by mass, and still more preferably 1.0% to 10% by mass, with respect to the total solid content of the composition Y.

One kind of alkali-soluble resin may be used alone, or two or more kinds thereof may be used in combination. In a case where two or more kinds of alkali-soluble resins are used in combination, the total content thereof is preferably within the above range.

In a case where the composition Y contains a low-molecular-weight compound containing an ethylenic unsaturated group, the content thereof is not particularly limited; however, it is preferably 1% to 25% by mass, more preferably 1% to 20% by mass, and still more preferably 3% to 15% by mass, with respect to the total solid content of the composition Y. One kind of the low-molecular-weight compound having an ethylenic unsaturated group may be used alone, or two or more kinds thereof may be used in combination. In a case where a low-molecular-weight compound containing two or more kinds of ethylenic unsaturated groups is used in combination, the total content thereof is preferably within the above range.

<Resin Having Graft Chain (Resin BY)>

The composition Y contains a resin having a graft chain (the resin BY). The resin BY preferably does not contain an ethylenic unsaturated group.

The content of the resin BY in the composition Y is not particularly limited; however, it is preferably 2% to 40% by mass, more preferably 5% to 30% by mass, and still more preferably 10% to 20% by mass, with respect to the total solid content of the composition Y.

One kind of resin BY may be used alone, or two or more kinds thereof may be used in combination. In a case where two or more kinds of resins BY are used in combination, it is preferable that the total content is in the range described above.

The mass ratio (the content of the resin BY/the content of the specific iron-containing particle) of the content of the resin BY to the content of the specific iron-containing particle in the composition Y is preferably 0.05 to 1.00, more preferably 0.10 to 0.35, and still more preferably 0.12 to 0.35.

The resin BY preferably contains a repeating unit containing a graft chain. Examples of the repeating unit containing a graft chain that is contained in the resin BY include those having the same aspect as the repeating unit containing a graft chain contained in the resin BX, and the same applies to the preferred aspect thereof.

In the resin BY, the content of the repeating unit containing a graft chain is preferably 2% to 100% by mass, more preferably 2% to 90% by mass, and particularly preferably 5% to 30% by mass, with respect to the total mass of the resin BY in terms of mass. In a case where the repeating unit containing a graft chain is contained in this range, the specific iron-containing particle has high dispersibility, and the developability in the formation of a cured film is good.

In addition, the resin BY preferably contains a hydrophobic repeating unit that is different (that is, does not correspond to the repeating unit containing a graft chain) from the repeating unit containing a graft chain. Examples of the hydrophobic repeating unit that can be contained in the resin BY include those having the same aspect as the hydrophobic repeating unit that can be contained in the resin BX, and the same applies to the preferred aspect thereof.

In the resin BY, the content of the hydrophobic repeating unit is preferably 10% to 90% by mass and more preferably 20% to 80% by mass with respect to the total mass of the resin BY in terms of mass. Satisfactory pattern formation properties can be obtained in a case where the content is in the above range.

A functional group capable of forming an interaction with the specific iron-containing particle can be introduced into the resin BY. Examples of the functional group capable of forming an interaction with the specific iron-containing particle that can be contained in the resin BY include the same aspect as the functional group capable of forming an interaction with the specific iron-containing particle that can be contained in the resin BX, and the same applies to the preferred aspect thereof.

In a case where the resin BX contains a repeating unit containing a functional group capable of forming an interaction with the specific iron-containing particle (for example, a repeating unit containing an acid group), the content thereof is preferably 5% to 80% by mass and more preferably 10% to 60% by mass with respect to the total mass of the resin BY in terms of mass.

[Producing Method for Composition]

For the composition of the present invention, it is preferable to first produce a dispersion composition containing the specific iron-containing particles, and then the obtained dispersion composition is mixed with other components to obtain the composition.

The dispersion composition is preferably prepared by mixing the specific iron-containing particle, the resin BX or the resin BY, and a solvent. In addition, the dispersion composition may contain a polymerization inhibitor.

The specific iron-containing particle can be prepared by mixing each of the above components with a known mixing method (for example, a mixing method using a stirrer, a homogenizer, a high-pressure emulsifying device, a wet-type pulverizer, or a wet-type disperser).

In preparing the composition of the present invention, each of the components may be formulated at one time, or each of the components may be sequentially formulated after being dissolved or dispersed in a solvent. In addition, the order of charging and the working conditions at the time of formulation are not particularly limited.

In preparing the composition of the present invention, it is preferable that the particle diameter ratio T denoted by Expression (A) satisfies a range of 1 to 3.

Expression (A): the particle diameter ratio T=an average particle diameter (μm) of the specific iron-containing particles in the composition/an average primary particle diameter (μm) of the specific iron-containing particles.

The average particle diameter of the specific iron-containing particles in the composition can be measured using a dynamic light scattering type particle diameter distribution analyzer (for example, "Nanotrac UPA EX150" (manufactured by MicrotracBEL Corp.)) or the like.

[Production of Cured Film]

The composition layer formed using the composition of the present invention is cured to obtain a cured film (which includes a patterned cured film).

The producing method for a cured film is not particularly limited; however, it is preferable to include the following steps.

Composition layer forming step
Exposure step
Developing step

Hereinafter, each of the steps will be described.

[Composition Layer Forming Step]

In the composition layer forming step, a composition is applied onto a support or the like to form a layer (a composition layer) of the composition prior to the exposure. As the support, for example, a wiring board having an antenna unit or an inductor unit can be used.

As a method of applying a composition onto a support, various coating methods such as a slit coating method, an inkjet method, a spin coating method, a cast coating method, a roll coating method, and a screen printing method can be applied. The film thickness of the composition layer is preferably 5 to 50 μm, more preferably 5 to 40 μm, and still more preferably 10 to 30 μm. The composition layer applied onto the support can be dried (pre-baked) with, for example, a hot plate, an oven, or the like at a temperature of 50° C. to 140° C. for 10 to 300 seconds.

[Exposure Step]

In the exposure step, the composition layer formed in the composition layer forming step is exposed by irradiation with an actinic ray or a radiation, and the composition layer irradiated with light is cured.

The light irradiation method is not particularly limited; however, it is preferable to carry out irradiation with light through a photomask having a patterned opening part.

The exposure is preferably carried out by irradiation with a radiation. As the radiation that can be used for the exposure, an ultraviolet ray such as a g-ray, an h-ray, and an i-ray is particularly preferable, and a high-pressure mercury lamp is preferred as the light source. The irradiation intensity is preferably 5 to 1,500 mJ/cm$^2$ and more preferably 10 to 1,000 mJ/cm$^2$.

In a case where the composition contains a thermal polymerization initiator, the composition layer may be heated in the above exposure step. The heating temperature is not particularly limited; however, it is preferably 80° C. to 250° C. In addition, the heating time is not particularly limited; however, it is preferably 30 to 300 seconds.

In a case where the composition layer is heated in the exposure step, the exposure step may also serve as a post-heating step described later. In other words, in a case where the composition layer is heated in the exposure step, the producing method for a cured film may not include the post-heating step.

[Developing Step]

The developing step is a step of developing the exposed composition layer to form a cured film. In this step, the composition layer of the portion which is not irradiated with light in the exposure step is eluted, only the photo-cured portion remains, and thus a patterned cured film can be obtained.

The kind of developer that is used in the developing step is not particularly limited; however, an alkaline developer that does not damage the circuit or the like is desirable.

The developing temperature is, for example, 20° C. to 30° C.

The developing time is, for example, 20 to 90 seconds. In recent years, the development is often carried out for 120 to 180 seconds in order to remove the residue better. Further, in order to further improve the residue removability, a step of shaking off the developer every 60 seconds and further supplying a new developer may be repeated several times.

As the alkaline developer is preferably an alkaline aqueous solution prepared by dissolving an alkaline compound in water so that have the concentration thereof is 0.001% to 10% by mass (preferably, 0.01% to 5% by mass).

Examples of the alkaline compounds include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, and 1,8-diazabicyclo[5.4.0]-7-undecene (among them, an organic alkali is preferable).

In a case where an alkaline developer is used, washing treatment with water is generally followed after the development.

[Post-Baking]

After the exposure step, it is preferable to carry out heat treatment (post-baking). The post-baking is a heat treatment for completing curing, after the development. The heating temperature thereof is preferably 240° C. or lower and more preferably 220° C. or lower. The lower limit thereof is not particularly limited; however, considering an efficient and effective treatment, it is preferably 50° C. or higher and more preferably 100° C. or higher.

The post-baking can be carried out continuously or in batch using a heating unit such as a hot plate, a convection oven (a hot air circulation type dryer), or a high frequency heater.

The above post-baking is preferably carried out in an atmosphere having a low oxygen concentration. The oxygen concentration of the atmosphere is preferably 19% by volume or less, more preferably 15% by volume or less, still more preferably 10% by volume or less, particularly preferably 7% by volume or less, and most preferably 3% by volume or less. The lower limit thereof is not particularly limited; however, 10 ppm by volume or more is practical.

In addition, the curing may be completed by ultraviolet (UV) irradiation instead of the post-baking with heating described above.

In this case, the composition described above preferably further contains a UV curing agent. The UV curing agent is preferably a UV curing agent with which curing can be carried out at a wavelength shorter than 365 nm, which is the exposure wavelength of a polymerization initiator that is added for the lithography process by the ordinary i-ray exposure. Examples of the UV curing agent include Ciba IRGACURE 2959 (trade name). In a case where UV irradiation is carried out, it is preferable that the material of the composition layer is a material that is cured at a wavelength of 340 nm or less. The lower limit value of the wavelength is not particularly present; however, it is generally 220 nm or more. In addition, the exposure amount of UV irradiation is preferably 100 to 5,000 mJ, more preferably 300 to 4,000 mJ, and still more preferably 800 to 3,500 mJ. It is preferable that this UV curing step is carried out after the exposure step in order to carry out low temperature curing more effectively. It is preferable to use an ozoneless mercury lamp as the exposure light source.

[Physical Properties of Cured Film and Use Application of Cured Film]

The film thickness of the cured film is, for example, preferably 5 to 40 μm and more preferably 10 to 30 μm.

It is preferable that the cured film has a magnetic permeability real part μ' of 1.5 or more at a frequency of 5 GHz and a magnetic loss tan δ of 0.05 or less at a frequency of 5 GHz. In addition, it is preferable that the cured film has a magnetic permeability real part μ' of 1.5 or more at a frequency of 100 MHz and a magnetic loss tan δ of 0.05 or less at a frequency of 100 MHz.

Since the cured film exhibits a high magnetic permeability real part μ' and a low magnetic loss tan δ in the high frequency region, it is suitably used as an electronic component such as an antenna and an inductor, which is installed in the electronic communication instrument or the like.

EXAMPLES

Hereinafter, the present invention will be described in more detail based on Examples. The materials, amounts of use, proportions, treatments, procedures, and the like described in the following Examples can be modified as appropriate as long as the gist of the invention is maintained. Therefore, the scope of the present invention should not be restrictively interpreted by the following Examples.

[Various Components Shown in Table 1]

Hereinafter, first, various components shown in Table 1 will be described.

[Magnetic Particle]

Magnetic particles P1 to P5 shown in the column of "Magnetic particle" of Table 1 are described below.

P1: Iron-cobalt alloy particle (abbreviated as "Fe—Co" in the table, made by DOWA Electronics Materials Co., Ltd., average primary particle diameter: 0.1 μm)

P2: Iron-cobalt alloy particle (made by DOWA Electronics Materials Co., Ltd., average primary particle diameter: 0.045 μm)

P3: Iron-cobalt alloy particle (made by DOWA Electronics Materials Co., Ltd., average primary particle diameter: 0.25 μm)

P4: Fe-based amorphous particle (manufactured by DOWA Electronics Materials Co., Ltd., average primary particle diameter: 3 μm (an iron-containing particle, corresponding to the amorphous particle))

P5: Co-based amorphous particle (average primary particle diameter: 3 μm)

[Resin (Dispersing Agent)]

The resins B1 to B4 shown in the column of "Resin (dispersing agent)" of Table 1 are described below.

<Resin B1>

As the resin B1, a resin synthesized by the method described below was used.

(Synthesis of resin B1)

<<Synthesis of macromonomer B1>>

ε-caprolactone (1,044.2 g), δ-valerolactone (184.3 g), and 2-ethyl-1-hexanol (71.6 g) were introduced into a three-neck flask having a volume of 3,000 mL to obtain a mixture. Next, the mixture was stirred while blowing nitrogen. Next, Disperbyk 111 (12.5 g, manufactured by BYK Additives & Instruments, a phosphoric acid resin) was added to the mixture, and the obtained mixture was heated to 90° C. After 6 hours, $^1$H-nuclear magnetic resonance (NMR) was used to confirm that the signal derived from 2-ethyl-1-hexanol in the mixture had disappeared, and then the mixture was heated to 110° C. After continuing the polymerization reaction at 110° C. for 12 hours under nitrogen, the disappearance of the signals derived from ε-caprolactone and δ-valerolactone was confirmed by $^1$H-NMR, and the obtained compound was subjected to a gel permeation chromatography (GPC) method to measure the molecular weight. After confirming that the molecular weight of the compound reached the desired value, 2,6-di-t-butyl-4-methylphenol (0.35 g) was added to the mixture containing the above compound, and then 2-methacryloyloxyethyl isocyanate (87.0 g) was further added dropwise to the obtained mixture over 30 minutes. Six hours after the completion of the dropwise addition, the disappearance of the signal derived from 2-methacryloyloxyethyl isocyanate (MOI) was confirmed by $^1$H-NMR, and then propylene glycol monomethyl ether acetate (PG-MEA) (1,387.0 g) was added to the mixture, whereby a macromonomer $B_1$ solution (2,770 g) with a concentration of 50% by mass was obtained. The weight-average molecular weight of the obtained macromonomer B1 was 6,000.

<<Synthesis of resin B1>>

The above macromonomer B1 solution (200.0 g), methacrylic acid (MAA, 60.0 g), benzyl methacrylate (BzMA, 40.0 g), and PGMEA (366.7 g) were introduced into a three-neck flask having a volume of 1,000 mL to obtain a mixture. The mixture was stirred while blowing nitrogen. Next, the mixture was warmed to 75° C. while allowing nitrogen flow into the flask. Next, dodecyl mercaptan (5.85 g) and then V-601 (manufactured by FUJIFILM Wako Pure Chemical Corporation, a polymerization initiator, 1.48 g) were added to the mixture to initiate the polymerization reaction. After heating the mixture at 75° C. for 2 hours, V-601 (1.48 g) was further added to the mixture. After 2 hours, V-601 (1.48 g) was further added to the mixture. After the reaction was further carried out for 2 hours, the mixture was heated to 90° C. and stirred for 3 hours. The polymerization reaction was completed by the above operation.

After completion of the reaction, tetrabutylammonium bromide (TBAB, 7.5 g) and p-methoxyphenol (MEHQ, 0.13 g) were added thereto in atmospheric air, and then glycidyl methacrylate (GMA, 66.1 g) was added dropwise thereto. After completion of the dropwise addition, the reaction was continued in atmospheric air for 7 hours, and then the completion of the reaction was confirmed by acid value measurement. PGMEA (643.6 g) was added to the obtained mixture to obtain a 20% by mass solution of the resin B1 (hereinafter, also referred to as a "PGMEA solution of 20% by mass solution of the resin B1") was obtained. The weight-average molecular weight of the obtained resin B1 was 35.000, and the acid value was 50 mgKOH/mg. The resin B1 corresponds to the resin that has an ethylenic unsaturated group and a graft chain (the resin BX).

<Resin B2>

As the resin B2, a resin synthesized by the method described below was used.

(Synthesis of Resin B2)

The macromonomer B1 solution (200.0 g) which was used in the synthesis of the resin B1, MAA (60.0 g), BzMA (40.0 g), and PGMEA (366.7 g) were introduced into a three-neck flask having a volume of 1,000 mL to obtain a mixture. The mixture was stirred while blowing nitrogen. Next, the mixture was warmed to 75° C. while allowing nitrogen flow into the flask. Next, dodecyl mercaptan (5.85 g) and then V-601 (1.48 g) were added to the mixture to initiate the polymerization reaction. After heating the mixture at 75° C. for 2 hours, V-601 (1.48 g) was further added to the mixture. After 2 hours, V-601 (1.48 g) was further added to the mixture. After the reaction was further carried out for 2 hours, the mixture was heated to 90° C. and stirred for 3 hours. The polymerization reaction was completed by the above operation, and then the solid content was purified to obtain the resin B2. Then, the resin B2 and PGMEA were mixed to prepare a 20% by mass solution of the resin B2 (hereinafter, also referred to as a "PGMEA solution of 20% by mass solution of the resin B2"). The weight-average molecular weight of the obtained resin B2 was 20,000, and the acid value was 70 mgKOH/mg. The resin B2 is a resin (the resin BY) that does not have an ethylenic unsaturated group and has a graft chain.

<Resin B3>

As the resin B3, the additive J-2 (a polyalkylene imine chain derivative) described in Example 1-2 of JP5923557B was used. The resin B3 is a resin (the resin BY) that does not have an ethylenic unsaturated group and has a graft chain.

<Resin B4>

The resin B4 was used in the form of a resin solution, which contained the resin B4 (Acrybase FF-187, solid content 40% by mass, manufactured by FUJIKURA KASEI Co., Ltd.). The resin B4 has a structure having none of an ethylenic unsaturated group and a graft chain.

[Compound Having Ethylenic Unsaturated Group]

<Resin (Post-Addition)>

The resin B5 shown in the column of "Resin (post-addition)" of Table 1 is described below.

<Resin B5>

The resin B5 was used in the form of a resin solution ("RD-F8", manufactured by Nippon Shokubai Co., Ltd., solid content: 40% by mass, solvent: propylene glycol monomethyl ether), which contained the resin B5 (an alkali-soluble resin). The resin B5 corresponds to the compound having an ethylenic unsaturated group.

<Polymerizable compound (low molecular weight)>

DPHA shown in the column of "Polymerizable compound (low molecular weight)" of Table 1 is described below. DPHA corresponds to the compound having an ethylenic unsaturated group.

DPHA: "KAYARAD DPHA" manufactured by Nippon Kayaku Co., Ltd.

[Polymerization Initiator]

The polymerization initiator I-1 shown in the column of "Polymerization initiator" of Table 1 is described below.

Polymerization Initiator 1-1: An oxime compound having the following structure

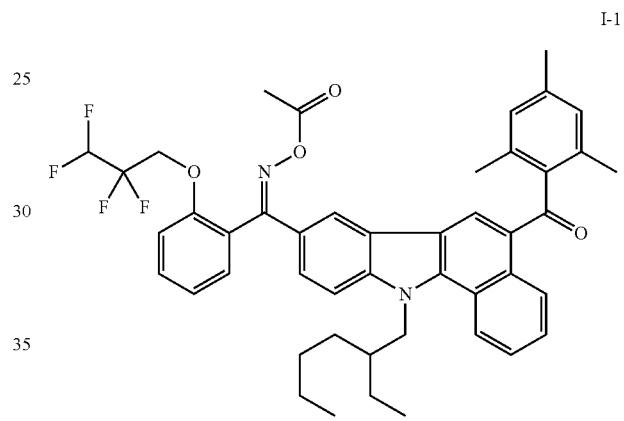

I-1

(Example 1) Preparation of Photosensitive Resin Composition a 1

Preparation of Dispersion Composition

Each of the components was blended so that the compositional ratio (the ratio in terms of part by mass) shown below was obtained, and mixed and stirred with a stirrer to obtain a mixture. The mixture was subjected to dispersion using NPM-Pilot manufactured by Shinmaru Enterprises Corporation under the following dispersion conditions to obtain a dispersion composition.

Magnetic particles P1: 46 parts by mass

PGMEA solution of 20%/by mass solution of the resin B1: 40 parts by mass

PGMEA: 14 parts by mass

The dispersion conditions are as follows.

Bead diameter: φ0.05 mm, (YTZ, zirconia beads, manufactured by NIKKATO Corporation)

Bead filling rate: 65% by volume

Mill circumferential speed: 10 m/sec

Treatment liquid temperature: 19° C. to 21° C.

[Preparation of Photosensitive Resin Composition A1]

The above-described dispersion composition and other components described below were mixed to obtain a photosensitive resin composition A1.

Dispersion composition described above: 83 parts by mass

Resin solution containing resin B5 ("RD-F8", manufactured by Nippon Shokubai Co., Ltd., solid content: 40% by mass, solvent: propylene glycol monomethyl ether): 6.3 parts by mass PGMEA (solvent); 5.6 parts by mass Polymerizable compound (KAYARAD DPHA, manufactured by Nippon Kayaku Co., Ltd.): 3.1 parts by mass Polymerization initiator I-1 described above: 2.0 parts by mass p-methoxyphenol (polymerization inhibitor): 0.0003 parts by mass Surfactant (weight-average molecular weight (Mw)=15,311) represented by the following formula: 0.02 parts by mass

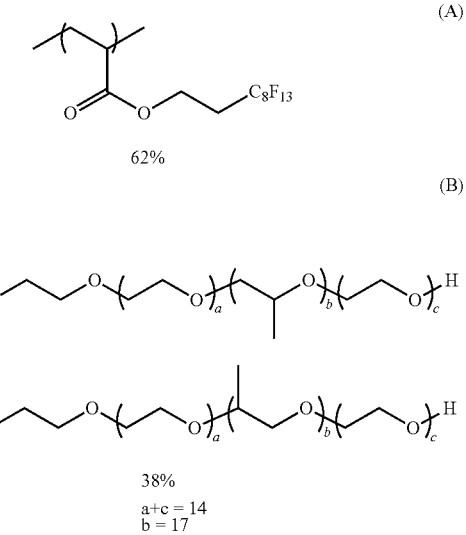

(However, in the above formula, the repeating units represented by (A) and (B) in the formula are respectively 62% by mole and 38% by mole. In the repeating unit represented by Formula (B), a, b, and c satisfy relationships of a+c=14 and b=17, respectively.)

(Example 2) Preparation of Photosensitive Resin Composition A2

A photosensitive resin composition A2 was prepared according to the same preparation method as that of the photosensitive resin composition A1 except that the magnetic particle P2 was used instead of the magnetic particle P1 in the preparation of the photosensitive resin composition A1.

(Example 3) Preparation of Photosensitive Resin Composition A3

A photosensitive resin composition A3 was prepared according to the same preparation method as that of the photosensitive resin composition A1 except that the addition amount of the PGMEA solution of 20% by mass solution of the resin B1 was changed to 20 parts by mass and the addition amount of PGMEA was changed to 34 parts by mass at the time of preparing the dispersion composition, in the preparation of the photosensitive resin composition A1.

(Example 4) Preparation of Photosensitive Resin Composition A4

A photosensitive resin composition A4 was prepared according to the same preparation method as that of the photosensitive resin composition A1 except that the magnetic particle P3 was used instead of the magnetic particle P1 in the preparation of the photosensitive resin composition A1.

(Example 5) Preparation of Photosensitive Resin Composition A5

A photosensitive resin composition A5 was prepared according to the same preparation method as that of the photosensitive resin composition A1 except that the PGMEA solution of 20% by mass solution of the resin B2 was used instead of the PGMEA solution of 20% by mass solution of the resin B1 in the preparation of the photosensitive resin composition A1.

(Example 6) Preparation of Photosensitive Resin Composition A6

A photosensitive resin composition A6 was prepared according to the same preparation method as that of the photosensitive resin composition A1 except that the resin B3 was used instead of the resin B1 in the preparation of the photosensitive resin composition A1.

It is noted that the content (the solid content) of the resin B3 in the photosensitive resin composition A6 was adjusted to be identical to the content (the solid content) of the resin B1 in the photosensitive resin composition A1. Further, the addition amount of the solvent (PGMEA) was adjusted so that the solid content concentration of the entire photosensitive resin composition A6 was identical to the solid content concentration of the entire photosensitive resin composition A1.

(Example 7) Preparation of Photosensitive Resin Composition A7

A photosensitive resin composition A7 was prepared according to the same preparation method as that of the photosensitive resin composition A1 except that the magnetic particle P4 was used instead of the magnetic particle P1 in the preparation of the photosensitive resin composition A1.

(Example 8) Preparation of Photosensitive Resin Composition A8

A photosensitive resin composition A8 was prepared according to the same preparation method as that of the photosensitive resin composition A5 except that the magnetic particle P4 was used instead of the magnetic particle P1 in the preparation of the photosensitive resin composition A5.

(Example 9) Preparation of Photosensitive Resin Composition A9

A photosensitive resin composition A9 was prepared according to the same preparation method as that of the photosensitive resin composition A6 except that the magnetic particle P4 was used instead of the magnetic particle P1 in the preparation of the photosensitive resin composition A6.

(Comparative Example 1) Preparation of Photosensitive Resin Composition C1

A photosensitive resin composition C1 was prepared according to the same preparation method as that of the photosensitive resin composition A1 except that the magnetic particle P5 was used instead of the magnetic particle P1 in the preparation of the photosensitive resin composition A1.

(Comparative Example 2) Preparation of Photosensitive Resin Composition C2

A photosensitive resin composition C2 was prepared according to the same preparation method as that of the photosensitive resin composition A1 except that the resin B4 was used instead of the resin B1 in the preparation of the photosensitive resin composition A1.

It is noted that the content (the solid content) of the resin B4 in the photosensitive resin composition C2 was adjusted to be identical to the content (the solid content) of the resin B1 in the photosensitive resin composition A1. Further, the addition amount of the solvent (PGMEA) was adjusted so that the solid content concentration of the entire photosensitive resin composition C2 was identical to the solid content concentration of the entire photosensitive resin composition A1.

(Comparative Example 3) Preparation of Photosensitive Resin Composition C3

A photosensitive resin composition C3 was prepared according to the same preparation method as that of the photosensitive resin composition C2 except that the magnetic particle P4 was used instead of the magnetic particle P1 in the preparation of the photosensitive resin composition C2.

[Evaluation]
[Magnetic Performance]

Each of the photosensitive resin compositions obtained in Examples and Comparative Examples was applied onto a 50 μm-thick polyethylene terephthalate (PET) film adhered on a glass substrate (75 mm×75 mm square, thickness: 1.1 mm) by using a spin coater (H-360S (trade name), manufactured by Mikasa Co., Ltd.) at a predetermined rotation speed, and then subjected to pre-baking at 100° C. for 120 seconds using a hot plate, whereby a composition layer was obtained. The obtained composition layer was exposed at 1,000 mJ/cm$^2$ with an ultra-high pressure mercury lamp ("USH-500BY" (trade name)) manufactured by Ushio Inc., and then heated at 100° C. for 600 seconds using a hot plate in an air atmosphere, whereby a cured film having a film thickness of 10 μm was obtained. Next, the obtained cured film was cut into a predetermined size as a sample for measuring magnetic permeability.

Next, the magnetic permeability of the obtained sample for measuring magnetic permeability was measured in the range of 0.1 to 20 GHz using a high-frequency magnetic permeability determination device (Model No. PER01 manufactured by KEYCOM Corp.). For the magnetic permeability, the values of "μ' (real part)" and "μ" (imaginary part)" at 100 MHz and 5 GHz were extracted. In addition, the value of the magnetic loss (tan δ) was obtained from the obtained values. It is noted that the value of the magnetic loss (tan δ) is obtained as μ"/μ'.

The values of the "magnetic permeability real part (μ')" and the "magnetic loss (tan δ)" at 100 MHz and 5 GHz, obtained according to the above method, were evaluated based on the following evaluation standard. The results are shown in Table 1.

<Magnetic permeability real part (μ')>
"A": More than 1.5
"B": More than 1.1 and less than 1.5
"C": Less than 1.1

<Magnetic loss: tan δ>
"A": 0.05 or less
"B": More than 0.05 and 0.3 or less
"C": More than 0.3

[Particle Diameter Ratio T]

The average particle diameter (D50) of the magnetic particles in the photosensitive resin composition was measured using a dynamic light scattering type particle diameter distribution analyzer (for example, "Nanotrac UPA EX150" (manufactured by MicrotracBEL Corp.)). Next, the particle diameter ratio T denoted by Expression (A) was calculated, and the obtained value was evaluated based on the following evaluation standard. The results are shown in Table 1.

The average primary particle diameters of the magnetic particles P1 to P5, which were used in Examples and Comparative Examples, are as described above. The method of obtaining the average primary particle diameter is as described above.

Expression (A): particle diameter ratio T=average particle diameter of magnetic particles in photosensitive resin composition/average primary particle diameter of magnetic particles.

"A": The particle diameter ratio T obtained according to Expression (A) is 1 to 3.
"B": The particle diameter ratio T obtained according to Expression (A) is more than 3 and 7 or less.
"C": The particle diameter ratio T obtained according to Expression (A) is more than 7.

Table 1 is shown below.

In Table 1, the "Iron atom content (% by mass)" represents the iron atom content (% by mass) in the magnetic particle with respect to the total mass of the magnetic particle. The iron atom content (% by mass) was measured by an inductive coupling plasma (ICP) emission spectrophotometer.

In Table 1, the resin B1 in the column of "Resin (dispersing agent)" corresponds to the resin (the resin BX) that has an ethylenic unsaturated group and a graft chain. In addition, the resin B2 and the resin B3 correspond to a resin (the resin BY) that does not have an ethylenic unsaturated group and has a graft chain.

TABLE 1

Main components of photosensitive resin composition

| | | Magnetic particle | | | | Resin (dispersing agent) | | | Ethylenically unsaturated compound | |
|---|---|---|---|---|---|---|---|---|---|---|
| Photosensitive composition No. | Kind | Composition | Iron atom content (% by mass) | average primary particle diameter (μm) | Kind | Presence or absence of ethylenic unsaturated group | Presence or absence of graft chain | Resin (post-addition) Kind | Polymerizable compound (low molecular weight) Kind | |
| Example 1 | A1 | P1 | Fe—Co | ≥10 | 0.1 | B1 | Present | Present | B5 | DPHA |
| Example 2 | A2 | P2 | Fe—Co | ≥10 | 0.045 | B1 | Present | Present | B5 | DPHA |
| Example 3 | A3 | P1 | Fe—Co | ≥10 | 0.1 | B1 | Present | Present | B5 | DPHA |
| Example 4 | A4 | P3 | Fe—Co | ≥10 | 0.25 | B1 | Present | Present | B5 | DPHA |
| Example 5 | A5 | P1 | Fe—Co | ≥10 | 0.1 | B2 | Absent | Present | B5 | DPHA |
| Example 6 | A6 | P1 | Fe—Co | ≥10 | 0.1 | B3 | Absent | Present | B5 | DPHA |
| Example 7 | A7 | P4 | Fe-based amorphous | ≥10 | 3 | B1 | Present | Present | B5 | DPHA |
| Example 8 | A8 | P4 | Fe-based amorphous | ≥10 | 3 | B2 | Absent | Present | B5 | DPHA |
| Example 9 | A9 | P4 | Fe-based amorphous | ≥10 | 3 | B3 | Absent | Present | B5 | DPHA |
| Comparative Example 1 | C1 | P5 | Fe-based amorphous | ≥10 | 3 | B1 | Present | Present | B5 | DPHA |
| Comparative Example 2 | C2 | P1 | Fe—Co | ≥10 | 0.1 | B4 | Absent | Absent | B5 | DPHA |
| Comparative Example 3 | C3 | P4 | Fe-based amorphous | ≥10 | 3 | B4 | Absent | Absent | B5 | DPHA |

| | | | | Evaluation | | | | |
|---|---|---|---|---|---|---|---|---|
| | | | | | Magnetic performance | | | |
| | | | | | 100 MHz | | 5 GHz | |
| | Photosensitive composition No. | Polymerization initiator | Particle diameter ratio T | Magnetic permeability real part μ' | Magnetic loss tan δ | Magnetic permeability real part μ' | Magnetic loss tan δ | |
| Example 1 | A1 | I-1 | A | A | A | A | A | |
| Example 2 | A2 | I-1 | A | A | A | A | A | |
| Example 3 | A3 | I-1 | B | B | A | B | B | |
| Example 4 | A4 | I-1 | B | B | A | B | B | |
| Example 5 | A5 | I-1 | A | A | A | A | A | |
| Example 6 | A6 | I-1 | A | A | A | A | A | |
| Example 7 | A7 | I-1 | A | A | A | A | B | |
| Example 8 | A8 | I-1 | A | A | A | A | B | |
| Example 9 | A9 | I-1 | A | A | A | A | B | |
| Comparative Example 1 | C1 | I-1 | B | A | C | C | C | |
| Comparative Example 2 | C2 | I-1 | C | B | C | C | C | |
| Comparative Example 3 | C3 | I-1 | C | A | C | C | C | |

From the results in Table 1, is clear that the photosensitive resin composition of Examples is excellent in dispersibility, and as a result, a cured film that is formed from the above composition has a high magnetic permeability real part μ' and a low magnetic loss tan δ in the high frequency region (for example, 5 GHz).

Since the photosensitive resin compositions of Example 1 and Example 2 have a particle diameter ratio T in the range of 1 to 3 (corresponding to the evaluation "A"), the magnetic permeability real part (μ') is high and the magnetic loss (tan δ) is low at both 100 MHz and 5 GHz.

As compared with the photosensitive resin composition of Example 1, the dispersibility of magnetic particles is inferior, and the particle diameter ratio T is slightly large in the photosensitive resin composition of Example 3 since the addition amount of the resin B1 (the resin (dispersing agent)) is small. As a result, the magnetic permeability real part (μ') at 100 MHz, the magnetic permeability real part (μ') at 5 GHz, and the magnetic loss (tan δ) are slightly inferior to those of Example 1. From the above comparison results, it can be seen that in a case where the "resin (dispersing agent)/magnetic particle" ratio is 0.10 to 0.35 (corresponding to Example 1), the particle diameter ratio T is in the range of 1 to 3, the magnetic permeability real part (μ') is higher, and the magnetic loss (tan δ) is lower.

As compared with the photosensitive resin composition of Example 1, the average primary particle diameter of magnetic particles is slightly large, the dispersibility is inferior, and the particle diameter ratio T is slightly large in the photosensitive resin composition of Example 4. As a result, the magnetic permeability real part (μ') at 100 MHz, the magnetic permeability real part (μ') at 5 GHz, and the magnetic loss (tan δ) are slightly inferior to those of Example 1. From the above comparison results, it can be seen that in a case where an iron-cobalt alloy particle is used as the magnetic particle and in a case where the average primary particle diameter of the magnetic particles is 0.01 to 0.20 μm (corresponding to Example 1), the particle diameter ratio T is in the range of 1 to 3, the magnetic permeability real part (μ') is higher, and the magnetic loss (tan δ) is lower.

As shown in the photosensitive resin compositions of Example 5 and Example 6, even in a case where the resin B2 or the resin B3, which does not have an ethylenic unsaturated group but has a graft chain, is used as the resin (dispersing agent), the same performance as that of the photosensitive resin composition of Example 1, in which the resin B1 having an ethylenic unsaturated group and a graft chain is used as the resin (dispersing agent), can be obtained.

As shown in the photosensitive resin compositions of Example 7, Example 8, and Example 9, even in a case where an Fe-based amorphous particle is used as the magnetic particle, the same performance as that of the photosensitive resin compositions of Example 1, Example 5, and Example 6, in which iron-cobalt alloy particles are used as the magnetic particles, can be obtained in the magnetic permeability real part (μ') and the magnetic loss (tan δ) at 100 MHz. That is, in a case where an Fe-based amorphous particle is used as the magnetic particle, it is effective for the use applications at several hundred MHz.

On the other hand, since a Co-based amorphous particle that is substantially free of an iron atom is used as the magnetic particle in the photosensitive resin composition of Comparative Example 1, the magnetic loss (tan δ) at 100 MHz, and the magnetic permeability real part (μ') and the magnetic loss (tan δ) at 5 GHz do not meet the desired requirement.

In addition, since the resin B4 which does not contain any one of an ethylenic unsaturated group or a graft chain is used as the resin (dispersing agent) in the photosensitive resin compositions of Comparative Example 2 and Comparative Example 3, the dispersibility of magnetic particles is significantly inferior, and the particle diameter ratio T is large. As a result, the magnetic loss (tan δ) at 100 MHz, and the magnetic permeability real part (p) and the magnetic loss (tan δ) at 5 GHz do not meet the desired requirement.

(Example 10) Pattern Formation Properties

Each of the photosensitive resin compositions obtained in Examples 1 to 9 was applied onto an 8-inch silicon wafer (a substrate) by a spin coating method to form a coating film. At this time, heat treatment (pre-baking) was carried out for 120 seconds using a hot plate at 100° C., and the rotation speed of the spin coater was adjusted so that the film thickness of the resin composition layer after drying was 10 μm. The dried photosensitive resin composition layer having a film thickness of 10 μm was exposed using an i-line stepper through a pattern mask having a pattern of a line and space of a width of 100 μm. The cured film after exposure was subjected to the puddle development at 23° C. for 60 seconds using an aqueous solution of 0.3% by mass of tetramethylammonium hydroxide, rinsed with a spin shower, and further washed with pure water to form a pattern, whereby a cured film having a pattern was obtained.

It has been confirmed that the photosensitive resin compositions obtained in Examples 1 to 9 have excellent pattern formation properties.

What is claimed is:

1. A photosensitive resin composition comprising:
   a resin that has an ethylenic unsaturated group and a graft chain, or a compound having an ethylenic unsaturated group and a resin having a graft chain;
   an iron-containing particle of which an iron atom content is 10% by mass or more; and
   a polymerization initiator,
   wherein a case where the photosensitive resin composition is cured to form a cured film, the cured film has a magnetic permeability real part μ' of 1.5 or more at a frequency of 5 GHz and a magnetic loss tan δ of 0.05 or less at a frequency of 5 GHz.

2. The photosensitive resin composition according to claim 1,
   wherein in a case where the photosensitive resin composition is cured to form a cured film, the cured film has a magnetic permeability real part μ' of 1.5 or more at a frequency of 100 MHz and a magnetic loss tan δ of 0.05 or less at a frequency of 100 MHz.

3. The photosensitive resin composition according to claim 2,
   wherein the iron-containing particle is an iron-cobalt alloy particle.

4. The photosensitive resin composition according to claim 3,
   wherein an average primary particle diameter of the iron-containing particles is 0.01 to 0.20 μm.

5. The photosensitive resin composition according to claim 2,
   wherein the iron-containing particle is an amorphous particle.

6. The photosensitive resin composition according to claim 2,
   wherein a mass ratio of a content of the resin to a content of the iron-containing particle is 0.10 to 0.35.

7. The photosensitive resin composition according to claim 2,
   wherein a particle diameter ratio T represented by Expression (A) is 1 to 3,
   Expression (A): the particle diameter ratio T= an average particle diameter (μm) of the iron-containing particles in the photosensitive resin composition/an average primary particle diameter (μm) of the iron-containing particles.

8. The photosensitive resin composition according to claim 1,
   wherein the iron-containing particle is an iron-cobalt alloy particle.

9. The photosensitive resin composition according to claim 8,
   wherein an average primary particle diameter of the iron-containing particles is 0.01 to 0.20 μm.

10. The photosensitive resin composition according to claim 1,
    wherein the iron-containing particle is an amorphous particle.

11. The photosensitive resin composition according to claim 1,
    wherein a mass ratio of a content of the resin to a content of the iron-containing particle is 0.10 to 0.35.

12. The photosensitive resin composition according to claim 1,
    wherein a particle diameter ratio T represented by Expression (A) is 1 to 3,
    Expression (A): the particle diameter ratio T= an average particle diameter (μm) of the iron-containing particles in the photosensitive resin composition/an average primary particle diameter (μm) of the iron-containing particles.

13. A photosensitive resin composition comprising:
a resin that has an ethylenic unsaturated group and a graft chain, or a compound having an ethylenic unsaturated group and a resin having a graft chain;
an iron-containing particle of which an iron atom content is 10% by mass or more; and
a polymerization initiator,
wherein in a case where the photosensitive resin composition is cured to form a cured film, the cured film has a magnetic permeability real part $\mu'$ of 1.5 or more at a frequency of 100 MHz and a magnetic loss tan $\delta$ of 0.05 or less at a frequency of 100 MHz.

14. A cured film that is formed by curing the photosensitive resin composition according to claim 1.

15. The cured film according to claim 14, wherein the cured film has a magnetic permeability real part $\mu'$ of 1.5 or more at a frequency of 100 MHz and a magnetic loss tan $\delta$ of 0.05 or less at a frequency of 100 MHz.

16. An inductor comprising the cured film according to claim 14.

17. An antenna comprising the cured film according to claim 14.

* * * * *